US010665587B2

(12) United States Patent
Ikeda et al.

(10) Patent No.: US 10,665,587 B2
(45) Date of Patent: May 26, 2020

(54) SEMICONDUCTOR DEVICE AND MANUFACTURING METHOD OF THE SAME

(71) Applicant: KABUSHIKI KAISHA TOSHIBA, Tokyo (JP)

(72) Inventors: Keiji Ikeda, Kanagawa (JP); Tsutomu Tezuka, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/002,100

(22) Filed: Jun. 7, 2018

(65) Prior Publication Data
US 2018/0301446 A1 Oct. 18, 2018

Related U.S. Application Data

(60) Division of application No. 15/205,484, filed on Jul. 8, 2016, now abandoned, which is a continuation of
(Continued)

(30) Foreign Application Priority Data

Jan. 9, 2014 (JP) .................................. 2014-002723

(51) Int. Cl.
H01L 27/088 (2006.01)
H01L 21/768 (2006.01)
(Continued)

(52) U.S. Cl.
CPC ...... H01L 27/088 (2013.01); H01L 21/76898 (2013.01); H01L 21/8221 (2013.01);
(Continued)

(58) Field of Classification Search
CPC .......................... H01L 29/66674–66734; H01L 29/7801–7826; H01L 29/04–045; H01L 27/1229; H01L 27/088; H01L 27/1225
See application file for complete search history.

(56) References Cited

U.S. PATENT DOCUMENTS 4,837,172 A * 6/1989 Mizuno ............. H01L 21/26506
438/475
2005/0179061 A1* 8/2005 Jang .................... H01L 27/1108
257/208
(Continued)

FOREIGN PATENT DOCUMENTS

JP 62-203359 9/1987
JP 63-169755 7/1988
(Continued)

OTHER PUBLICATIONS

English-language International Preliminary Report on Patentability including the Written Opinion of the International Searching Authority, from the International Bureau of WIPO for International Application No. PCT/JP2015/050392, dated Jul. 21, 2016.
(Continued)

Primary Examiner — Dale E Page
Assistant Examiner — Wilner Jean Baptiste
(74) Attorney, Agent, or Firm — Finnegan, Henderson, Farabow, Garrett & Dunner, L.L.P.

(57) ABSTRACT

According to one embodiment, A semiconductor device includes: a first semiconductor layer; and a plurality of first transistors including a plurality of first gate structures provided on the first semiconductor layer, a first channel region provided in the first semiconductor layer and under the first gate structure, and a plurality of first diffusion regions provided in the first semiconductor layer in a manner to sandwich the first channel region.

7 Claims, 23 Drawing Sheets

Related U.S. Application Data application No. PCT/JP2015/050392, filed on Jan. 8, 2015.

(51) Int. Cl.

| | | |
|---|---|---|
| *H01L 27/06* | (2006.01) | |
| *H01L 21/822* | (2006.01) | |
| *H01L 23/522* | (2006.01) | |
| *H01L 27/12* | (2006.01) | |
| *H01L 21/8234* | (2006.01) | |
| *H01L 23/535* | (2006.01) | |
| *H01L 29/06* | (2006.01) | |
| *H01L 29/786* | (2006.01) | |
| *H01L 23/485* | (2006.01) | |

(52) U.S. Cl.
CPC .... *H01L 21/823475* (2013.01); *H01L 23/522* (2013.01); *H01L 23/535* (2013.01); *H01L 27/0688* (2013.01); *H01L 27/1207* (2013.01); *H01L 27/1225* (2013.01); *H01L 27/1229* (2013.01); *H01L 29/0649* (2013.01); *H01L 29/7869* (2013.01); *H01L 29/78681* (2013.01); *H01L 29/78684* (2013.01); *H01L 23/485* (2013.01)

(56) References Cited

U.S. PATENT DOCUMENTS

| | | |
|---|---|---|
| 2006/0278985 A1 | 12/2006 | Lim et al. |
| 2007/0007532 A1 | 1/2007 | Kang et al. |
| 2007/0181882 A1 | 8/2007 | Lee |
| 2009/0079000 A1* | 3/2009 | Yamazaki ............ H01L 27/1229 257/351 |
| 2009/0294984 A1 | 12/2009 | Zhu |
| 2010/0295136 A1 | 11/2010 | Or-Bach et al. |
| 2011/0121285 A1 | 5/2011 | Yamazaki et al. |
| 2012/0273773 A1* | 11/2012 | Ieda ...................... H01L 27/105 257/43 |
| 2013/0099312 A1 | 4/2013 | Dao et al. |

FOREIGN PATENT DOCUMENTS

| | | |
|---|---|---|
| JP | 2009-94495 | 4/2009 |
| JP | 2009-135350 | 6/2009 |
| JP | 2010-212604 | 9/2010 |
| JP | 2010-225701 | 10/2010 |
| JP | 2011-204856 | 10/2011 |
| JP | 2011-243959 | 12/2011 |
| JP | 2013-93579 | 5/2013 |

OTHER PUBLICATIONS

Batude, P. et al. (2011). "Demonstration of low temperature 3D sequential FDSOI integration down to 50 nm gate length," 2011 *Symposium on VLSI Technology Digest of Technical Papers*; pp. 158-159.

Batude, P. et al. (2011). "Advances, Challenges and Opportunities in 3D CMOS Sequential Integration," *Electron Devices Meeting* 2011; pp. 7.3.1-7.3.4.

Naito, T. et al. (2010). "World's first monolithic 3D-FPGA with TFT SRAM over 90nm 9 layer Cu CMOS," 2010 *Symposium on VLSI Technology Digest of Technical Papers*; pp. 219-220.

Kohara, T. et al. (2009). "A CMOS Image Sensor With 2.5-e- Random Noise and 110-ke- Full Well Capacity Using Column Source Follower Readout Circuits," 2009 *Symposium on VLSI Circuits Digest of Technical Papers*; pp. 182-183.

* cited by examiner

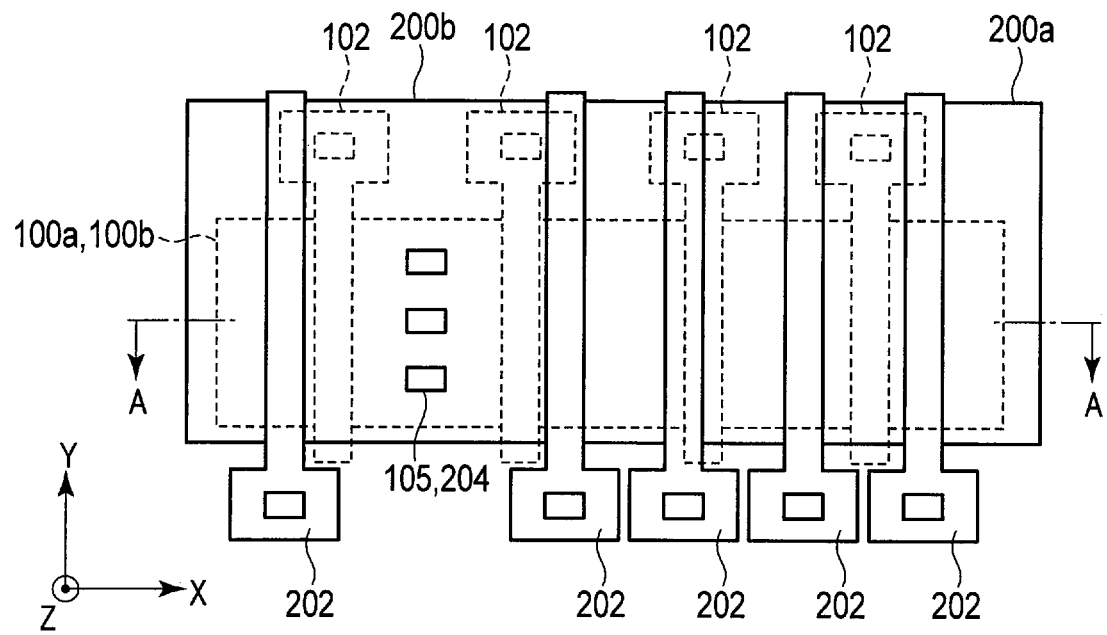
F I G. 1A
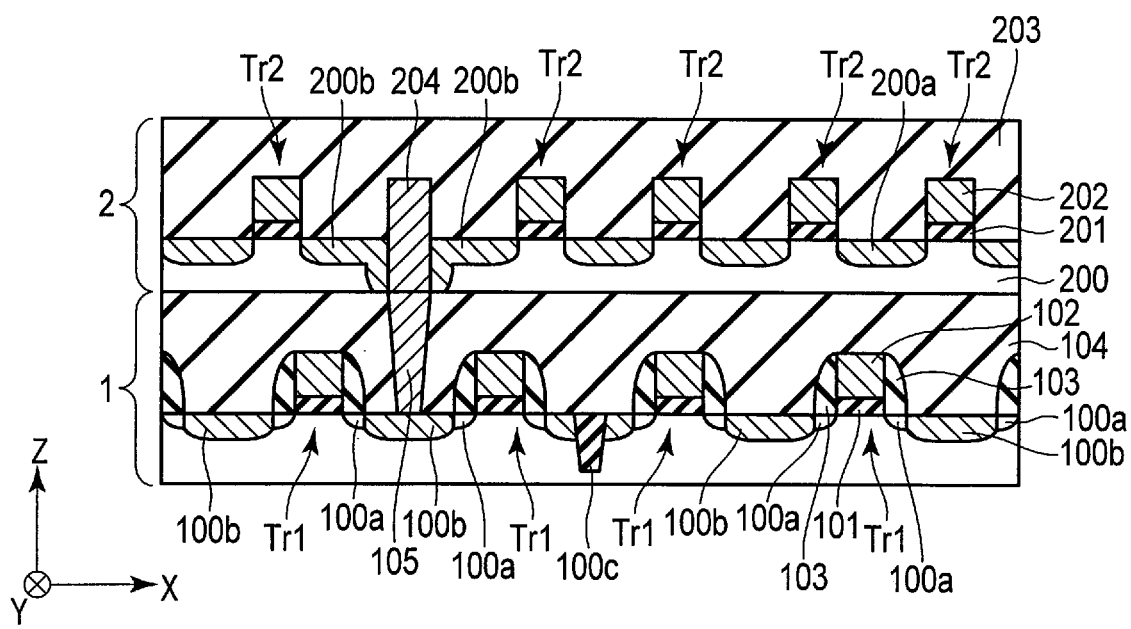
F I G. 1B

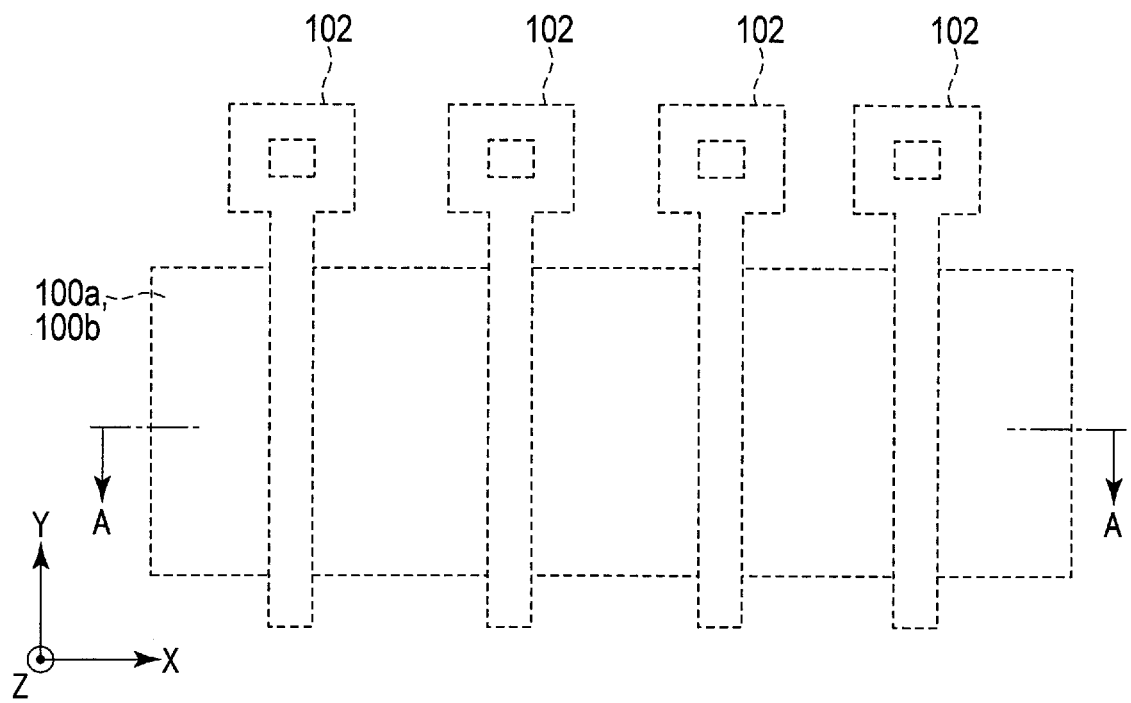
F I G. 7A
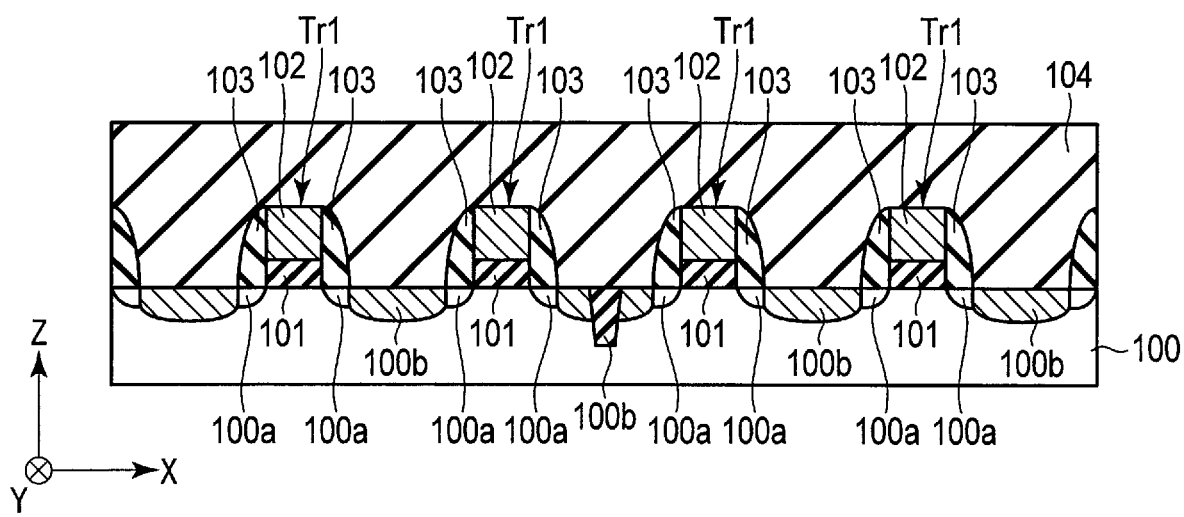
F I G. 7B

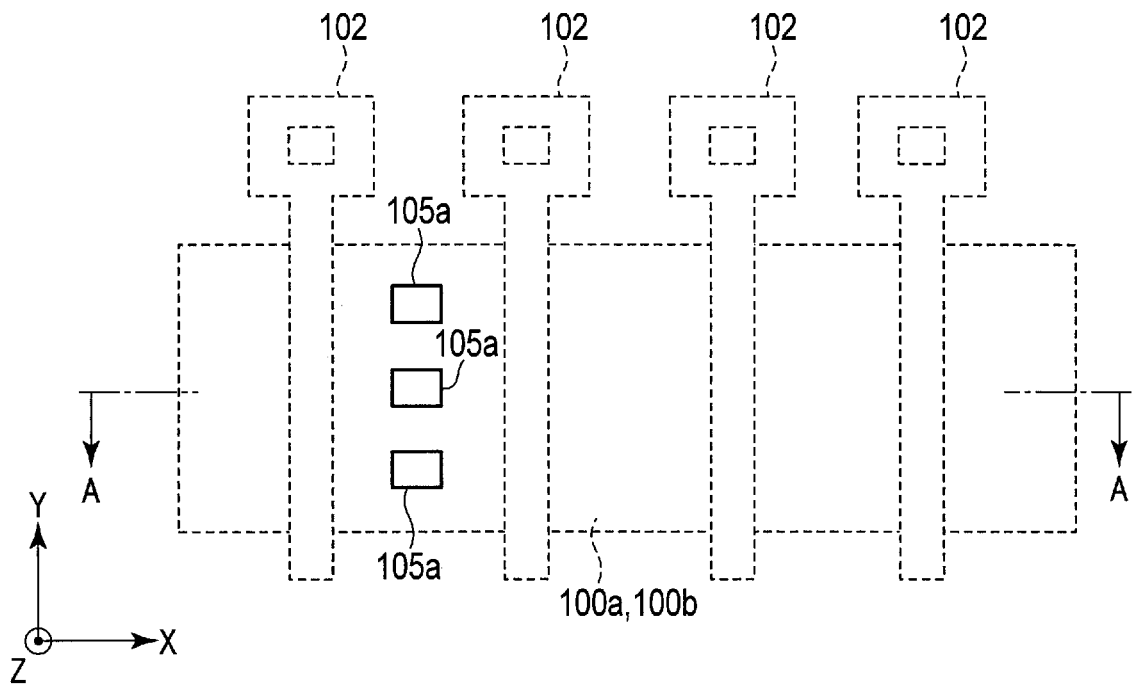
F I G. 9A
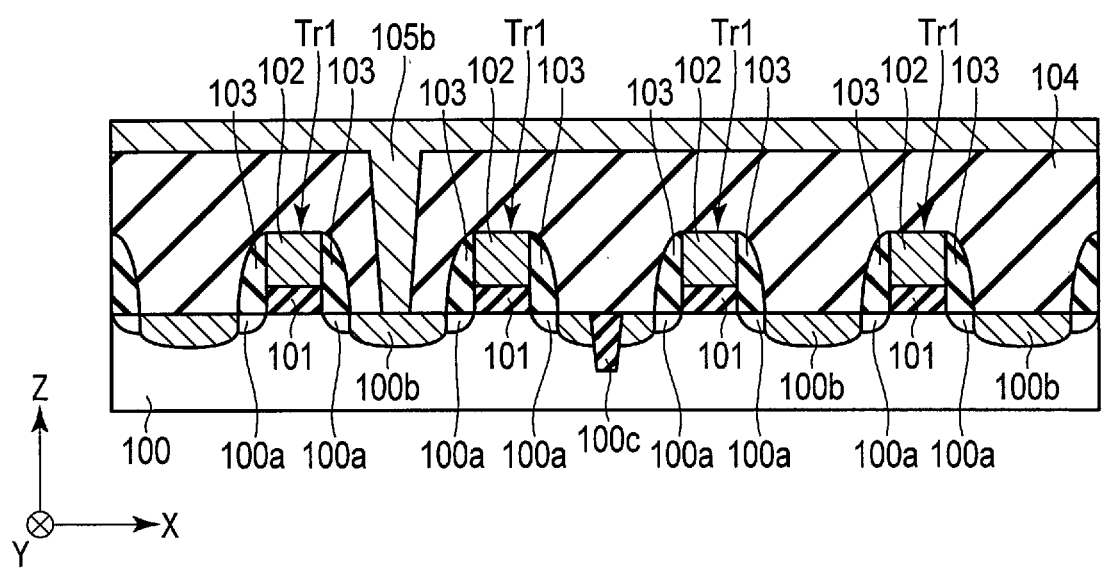
F I G. 9B

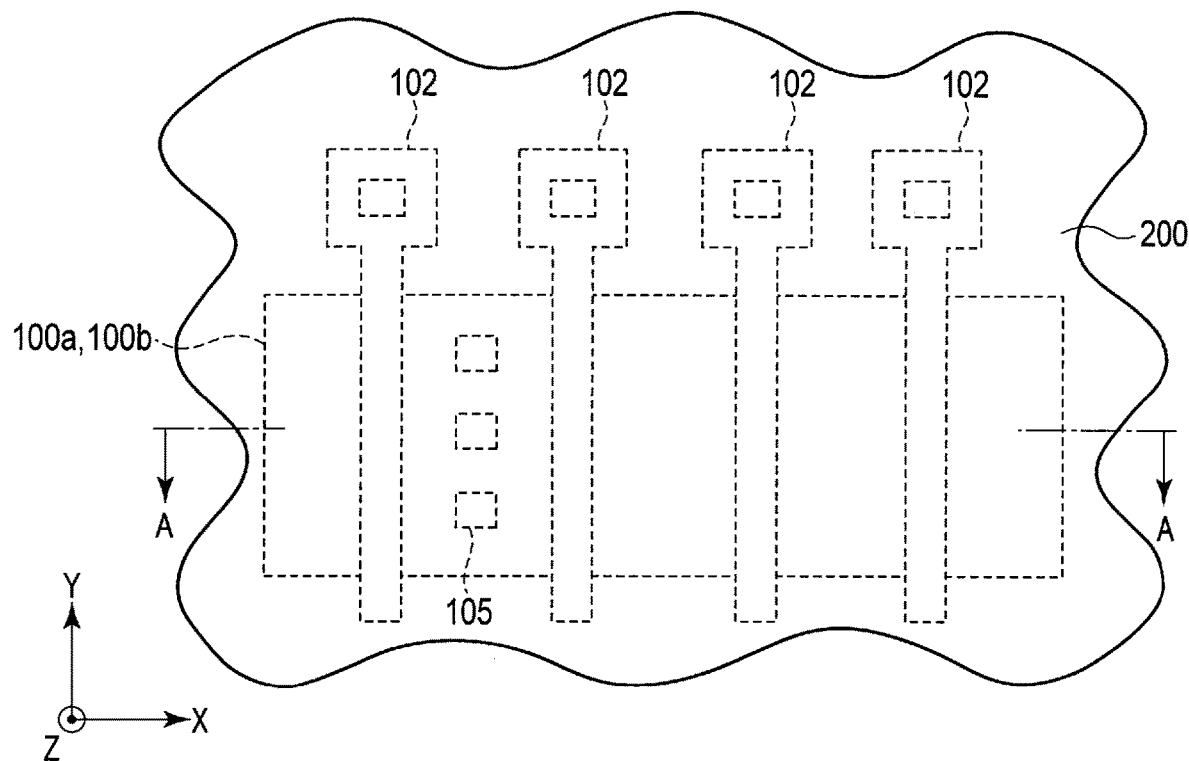
F I G. 10A
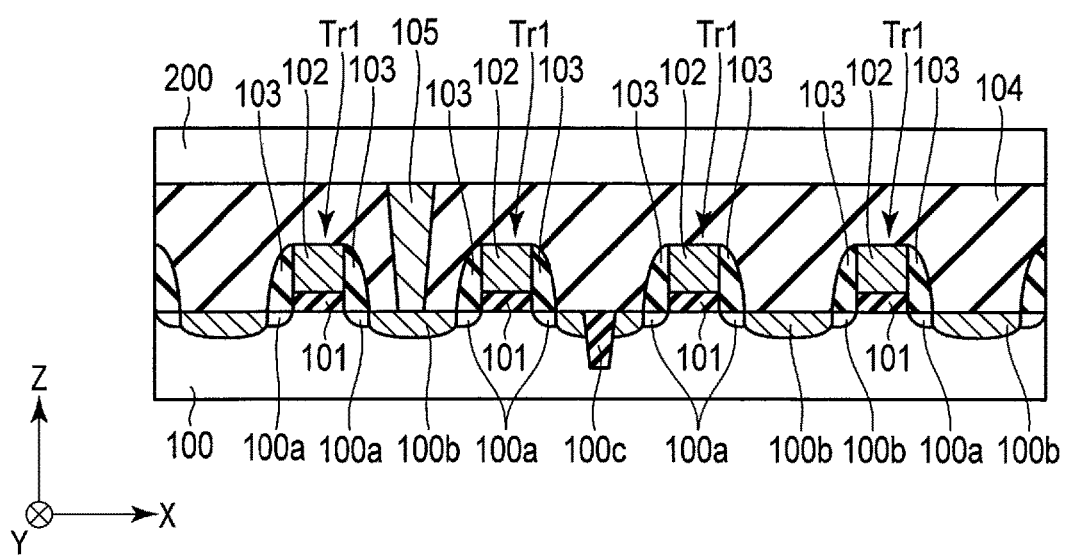
F I G. 10B

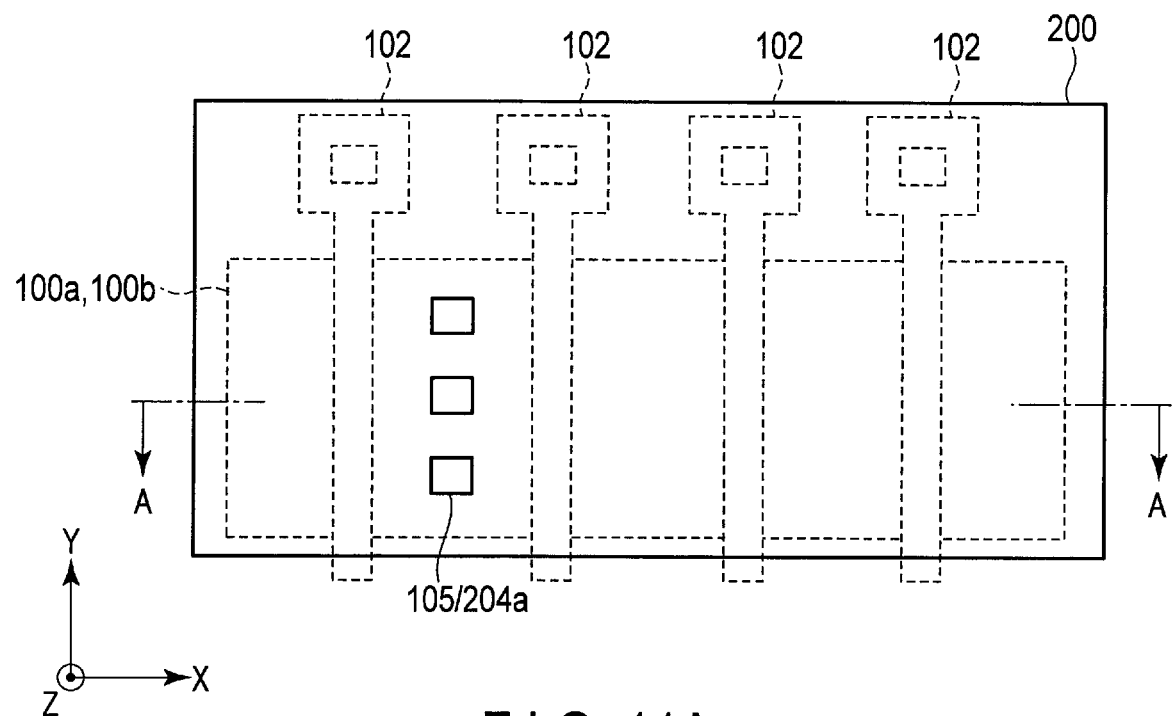
F I G. 11A
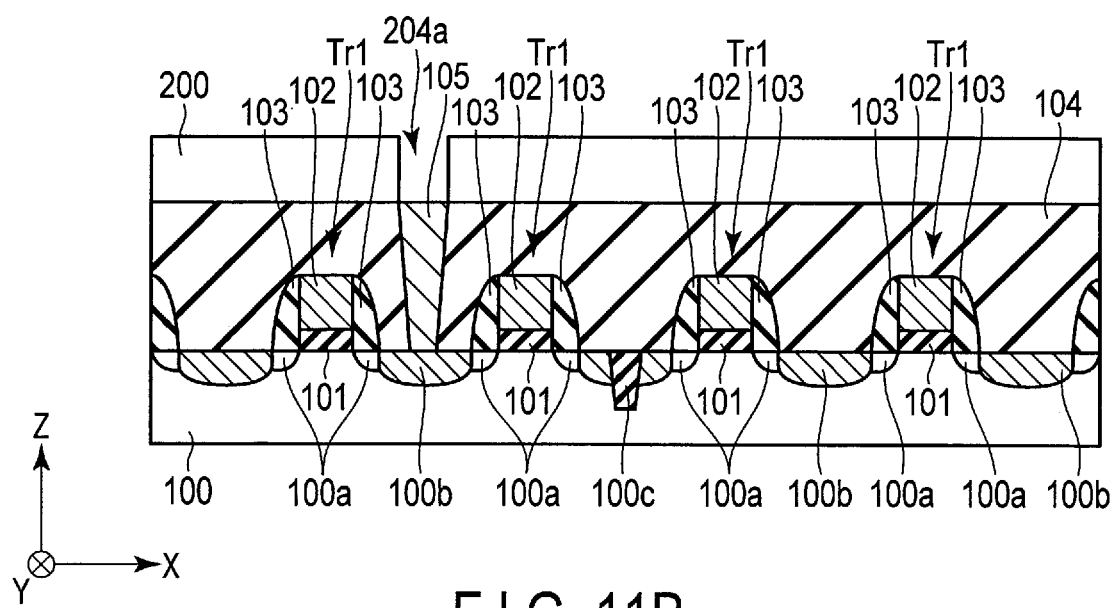
F I G. 11B

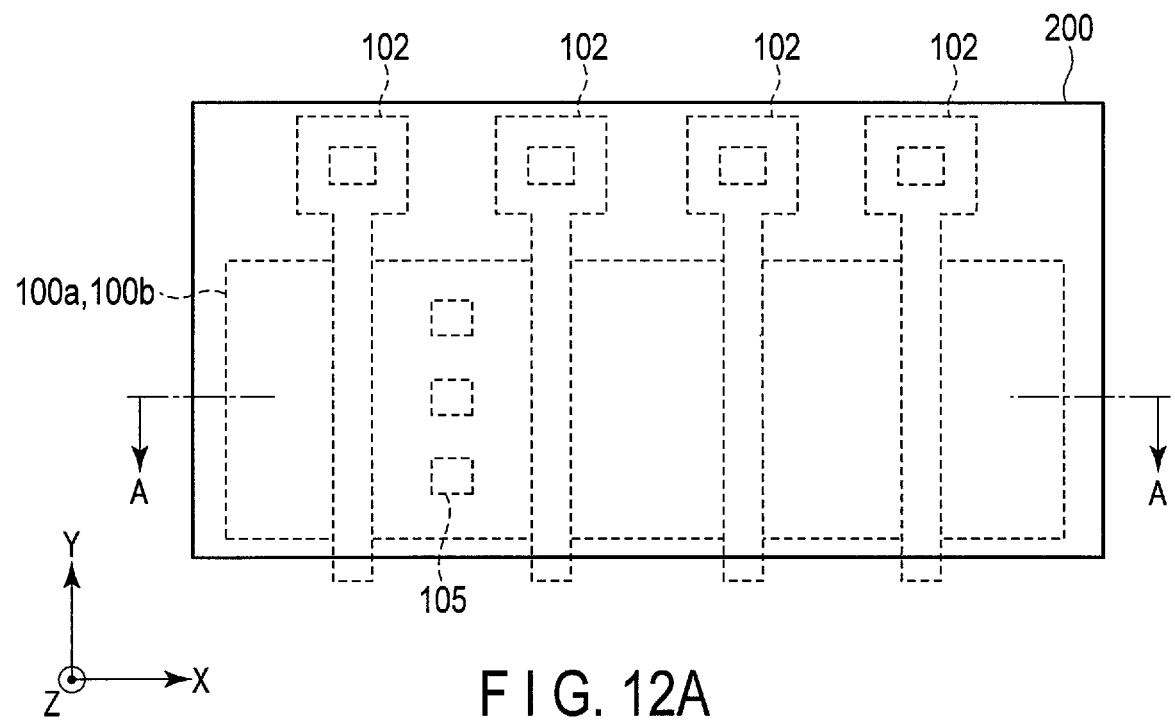
F I G. 12A
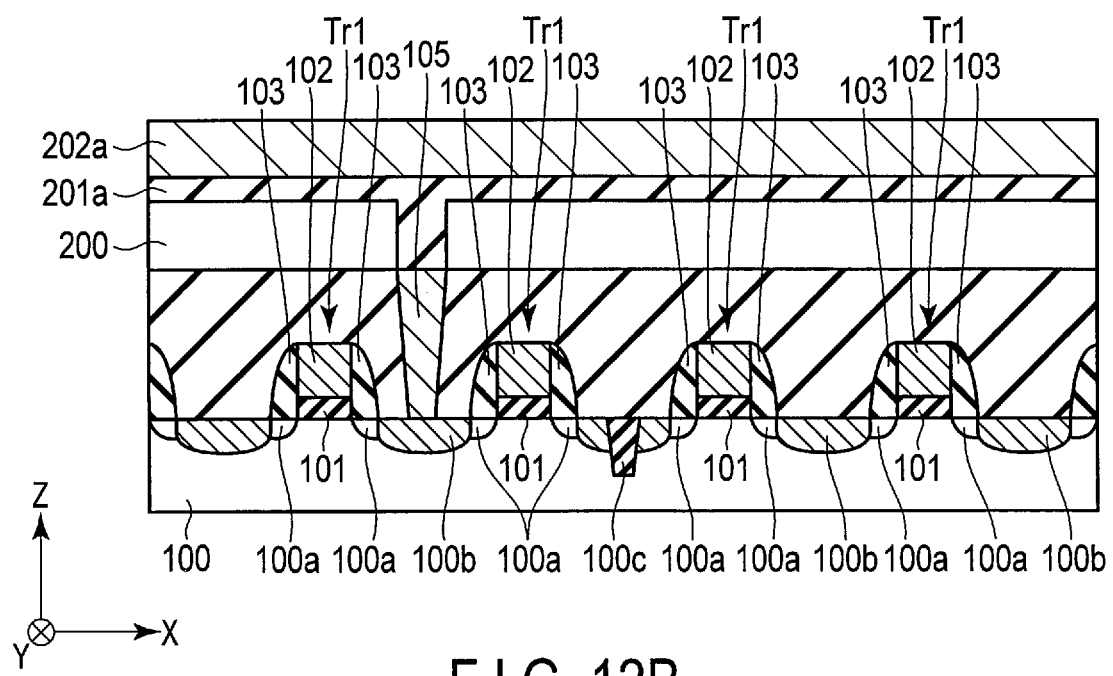
F I G. 12B

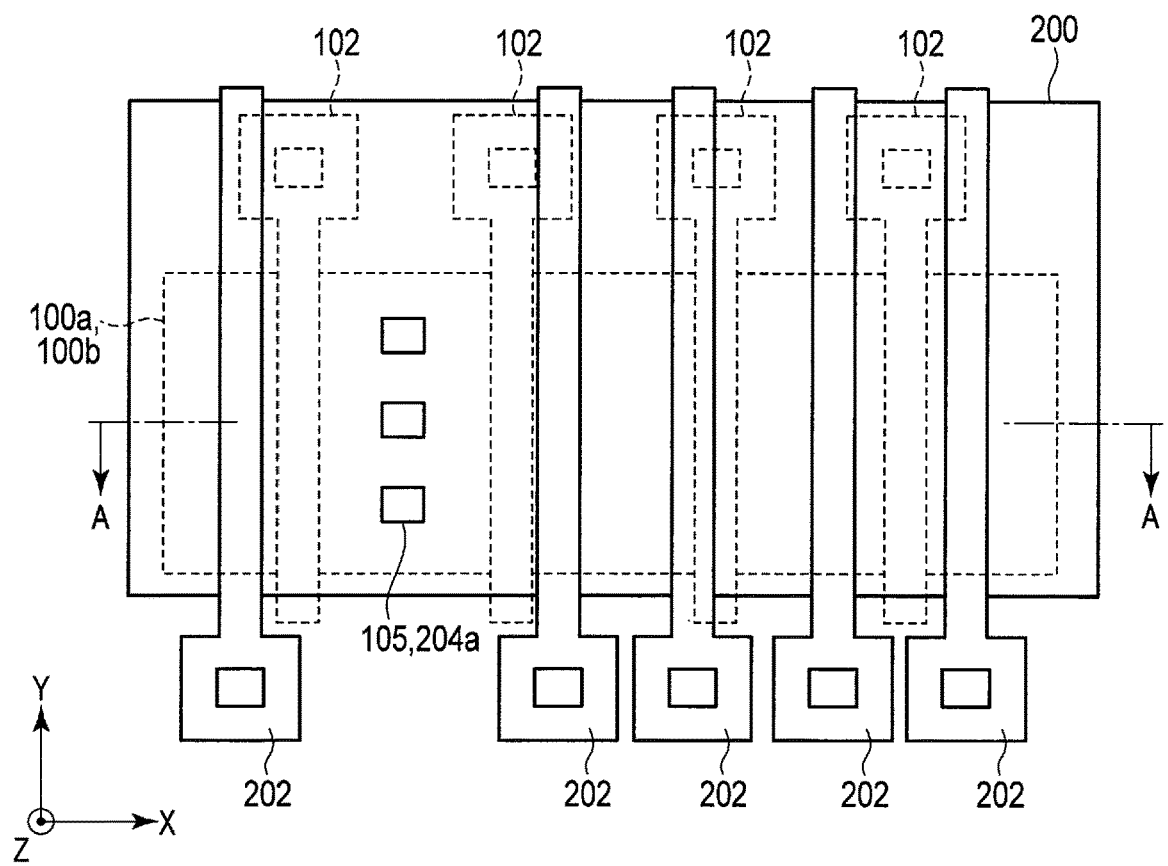
F I G. 13A
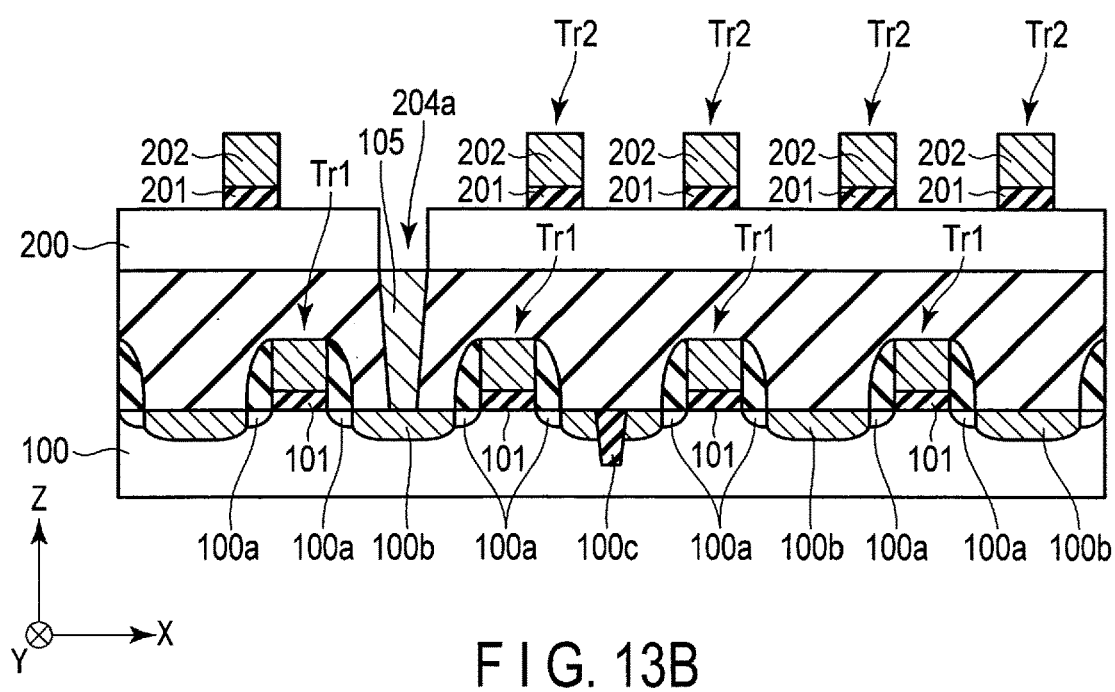
F I G. 13B

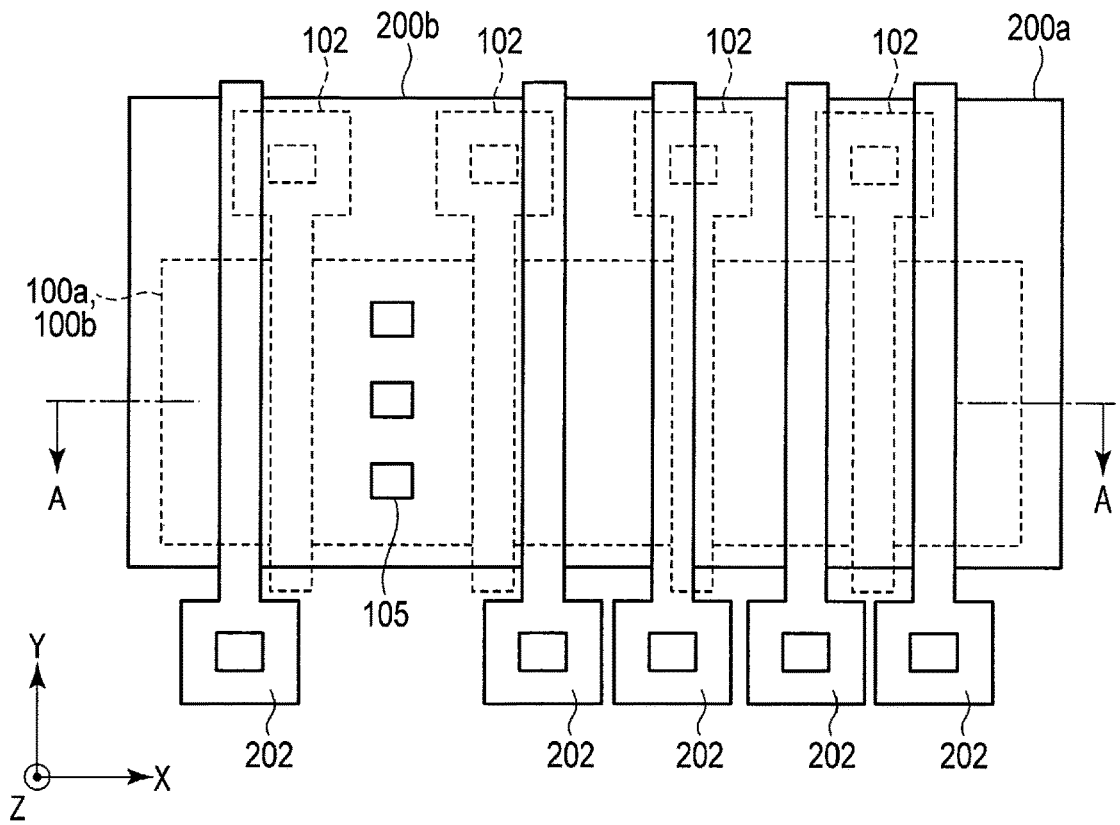
F I G. 14A
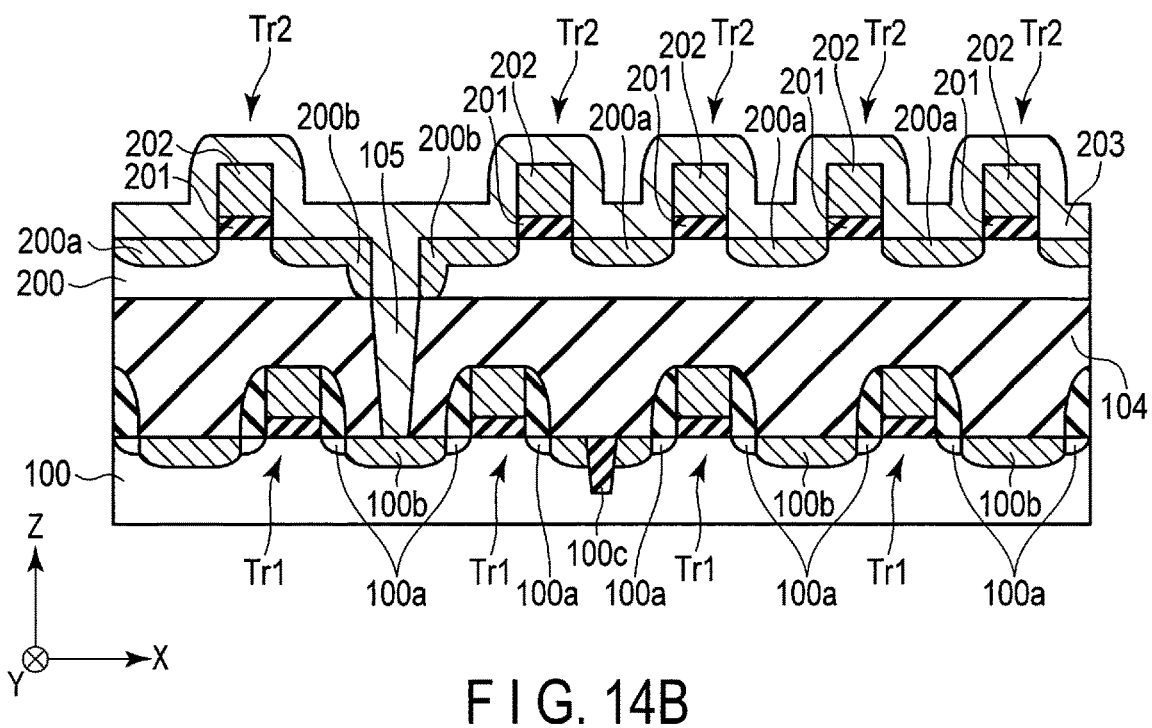
F I G. 14B

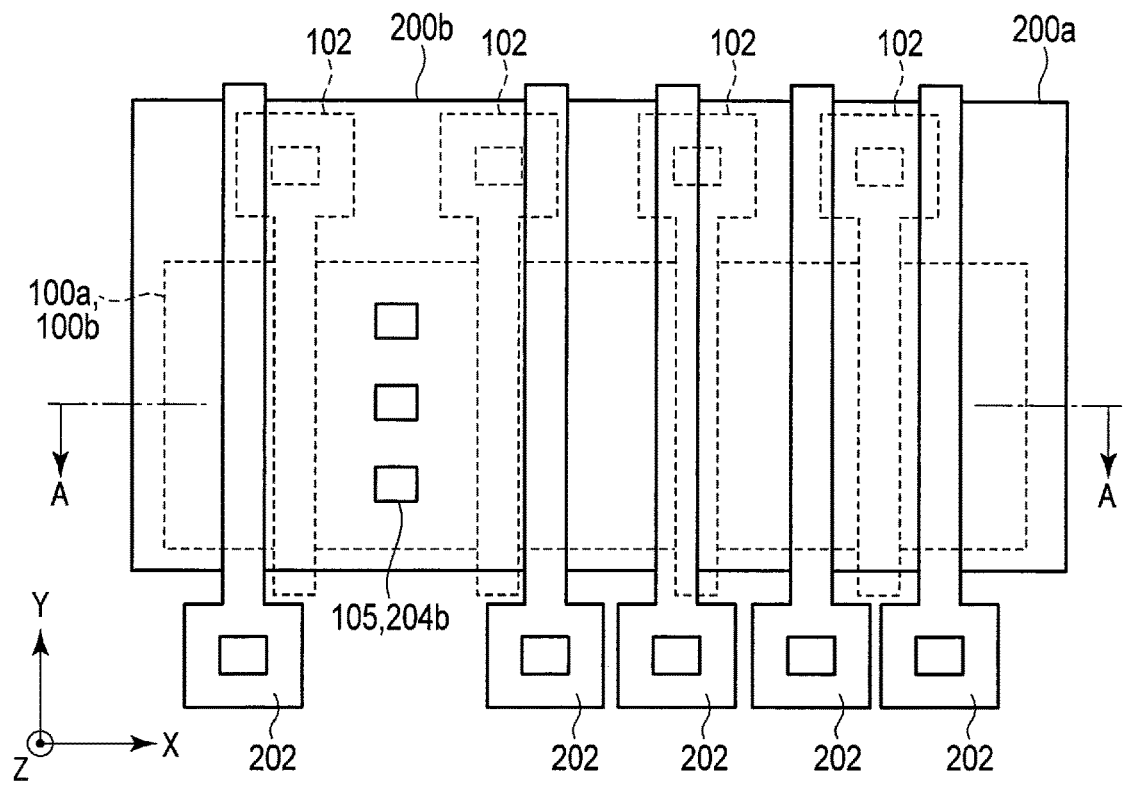
F I G. 16A
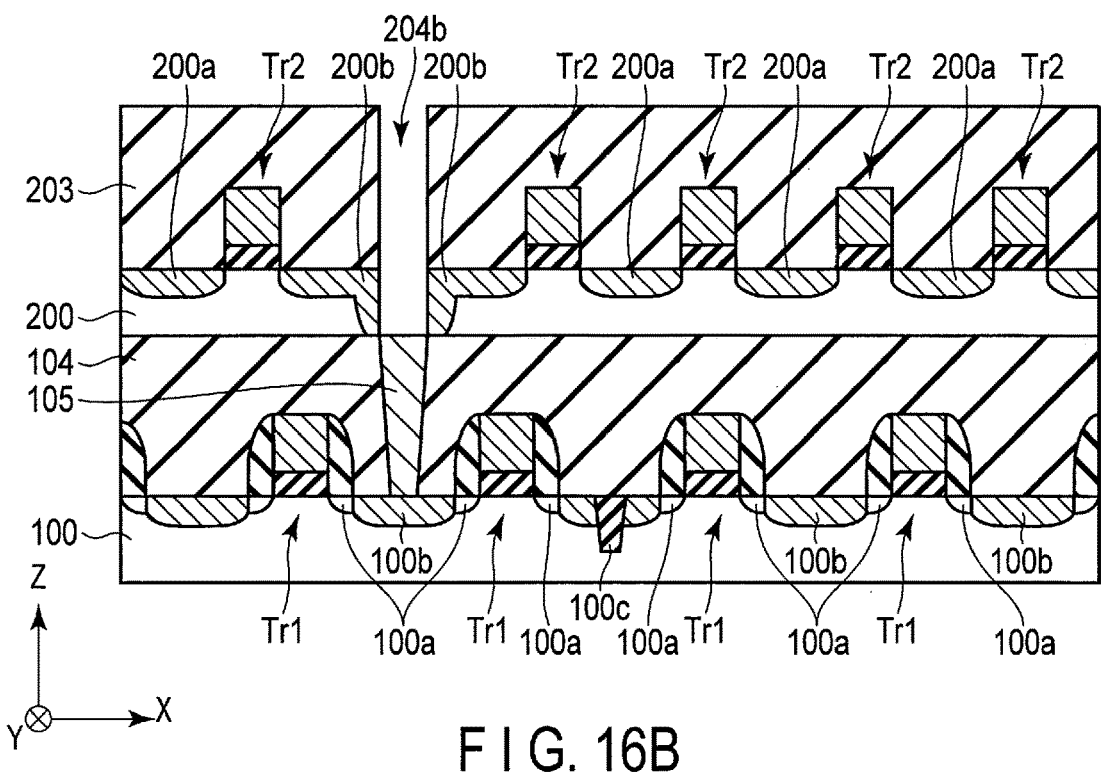
F I G. 16B

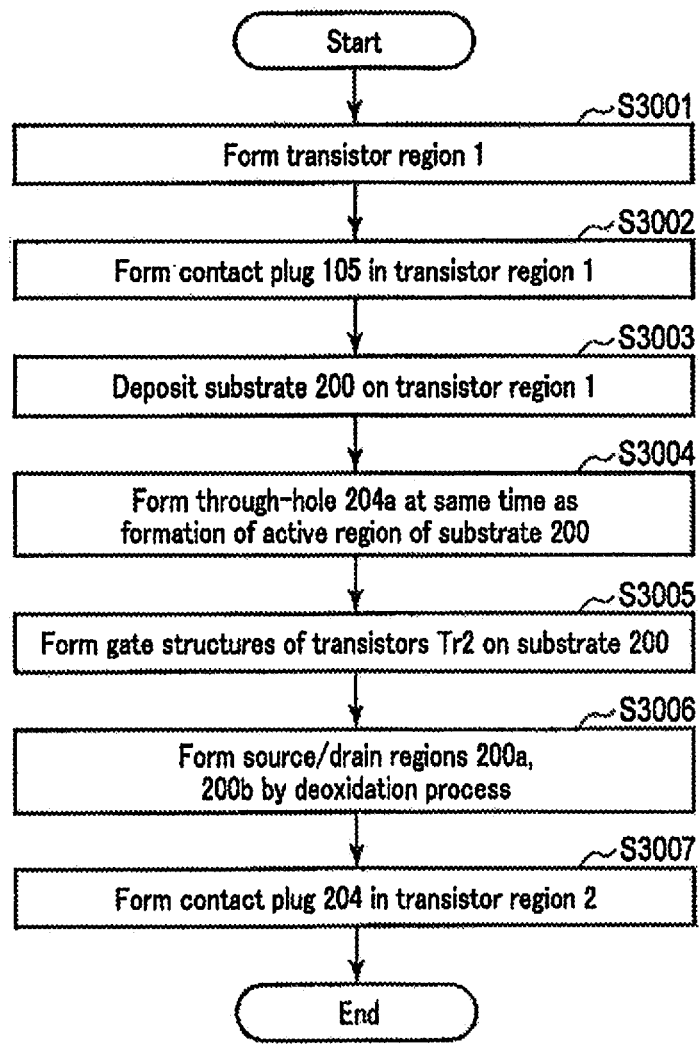
F I G. 20

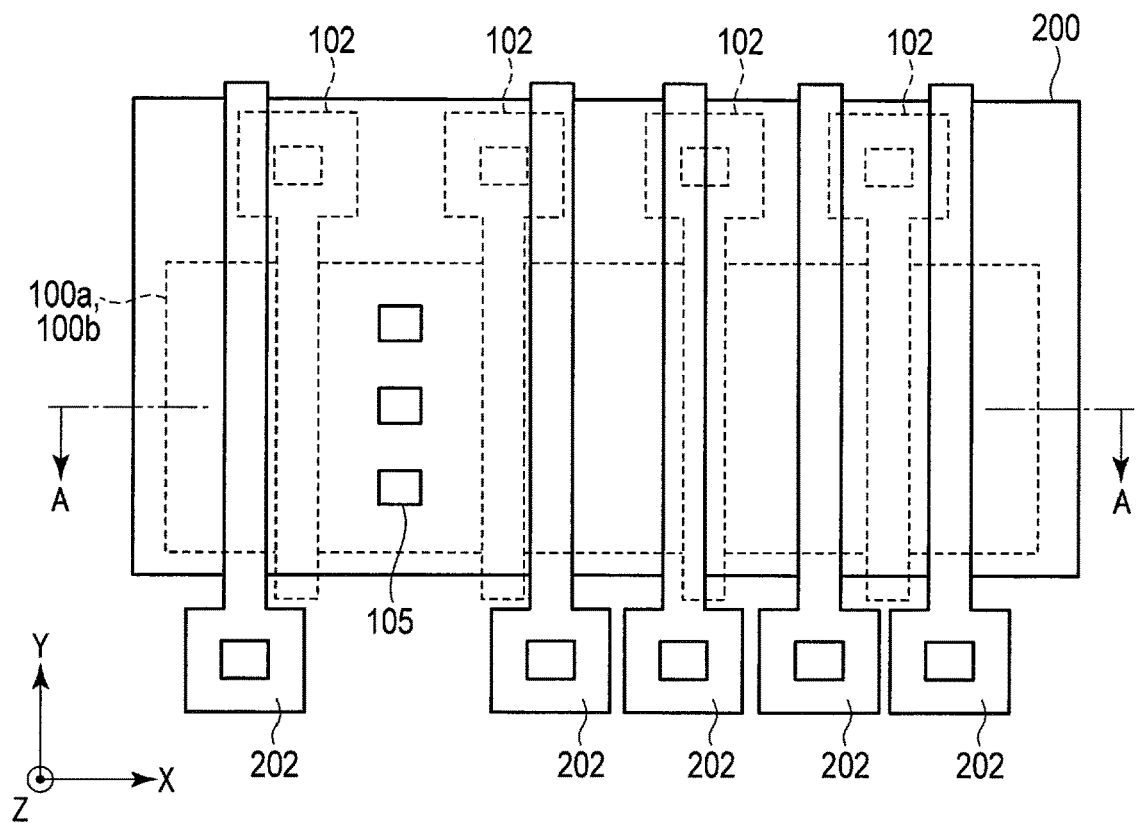
F I G. 21A
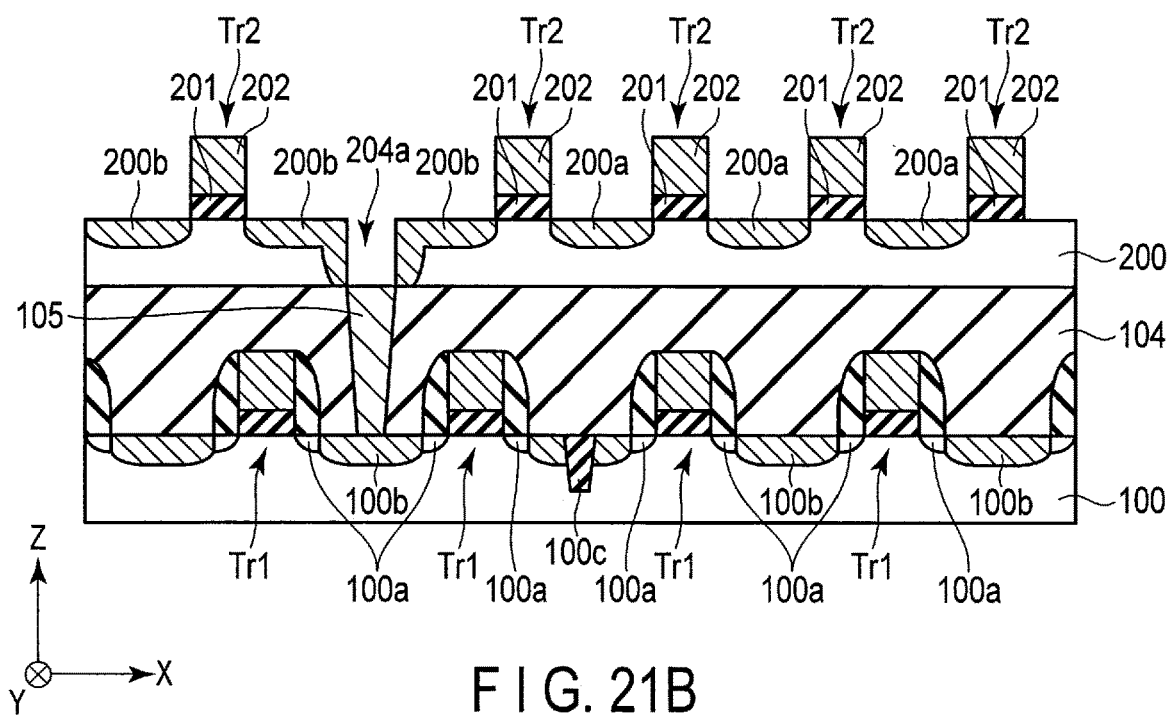
F I G. 21B

SEMICONDUCTOR DEVICE AND MANUFACTURING METHOD OF THE SAME

CROSS-REFERENCE TO RELATED APPLICATIONS

This application is a Divisional Application of U.S. patent application Ser. No. 15/205,484, filed Jul. 8, 2016, which is a Continuation Application of PCT Application No. PCT/JP2015/050392, filed Jan. 8, 2015, and based upon and claiming the benefit of priority from Japanese Patent Application No. 2014-002723, filed Jan. 9, 2014, the entire contents of all of which are incorporated herein by reference.

FIELD

Embodiments of the present invention relate to a semiconductor device and a manufacturing method of the semiconductor device.

BACKGROUND

In recent years, there is proposed a three-dimensional multilayer cell architecture including a construction in which at least two layers of conventional planar cell structures are stacked in a direction perpendicular to a major plane of a semiconductor substrate.

CITATION LIST

Non-Patent Literature

Non-patent document 1: P. Batude et al. VLSI Tech. Dig. (2011) 158.
Non-patent document 2: P. Batude et al. IEDM Tech. Dig. (2011) 151.
Non-patent document 3: T. Naito et al. VLSI Tech. Dig. (2010) 219.

BRIEF DESCRIPTION OF THE DRAWINGS

FIG. 1A is a top view of a semiconductor device according to a first embodiment.
FIG. 1B is a cross-sectional view taken along line A-A in FIG. 1A.
FIG. 7A is a top view which schematically illustrates a part of the manufacturing method of the semiconductor device according to the first embodiment.
FIG. 7B is a cross-sectional view taken along line A-A in FIG. 7A.
FIG. 9A is a top view which schematically illustrates a part of the manufacturing method of the semiconductor device according to the first embodiment.
FIG. 9B is a cross-sectional view taken along line A-A in FIG. 9A.
FIG. 10A is a top view which schematically illustrates a part of the manufacturing method of the semiconductor device according to the first embodiment.
FIG. 10B is a cross-sectional view taken along line A-A in FIG. 10A.
FIG. 11A is a top view which schematically illustrates a part of the manufacturing method of the semiconductor device according to the first embodiment.
FIG. 11B is a cross-sectional view taken along line A-A in FIG. 11A.
FIG. 12A is a top view which schematically illustrates a part of the manufacturing method of the semiconductor device according to the first embodiment.
FIG. 12B is a cross-sectional view taken along line A-A in FIG. 12A.
FIG. 13A is a top view which schematically illustrates a part of the manufacturing method of the semiconductor device according to the first embodiment.
FIG. 13B is a cross-sectional view taken along line A-A in FIG. 13A.
FIG. 14A is a top view which schematically illustrates a part of the manufacturing method of the semiconductor device according to the first embodiment.
FIG. 14B is a cross-sectional view taken along line A-A in FIG. 14A.
FIG. 16A is a top view which schematically illustrates a part of the manufacturing method of the semiconductor device according to the first embodiment.
FIG. 16B is a cross-sectional view taken along line A-A in FIG. 16A.

FIG. 20 is a flowchart illustrating a basic manufacturing method of a semiconductor device according to a third embodiment.

FIG. 21A is a top view which schematically illustrates a part of the manufacturing method of the semiconductor device according to the third embodiment.

FIG. 21B is a cross-sectional view taken along line A-A in FIG. 21A.

DETAILED DESCRIPTION

Figure 2A:
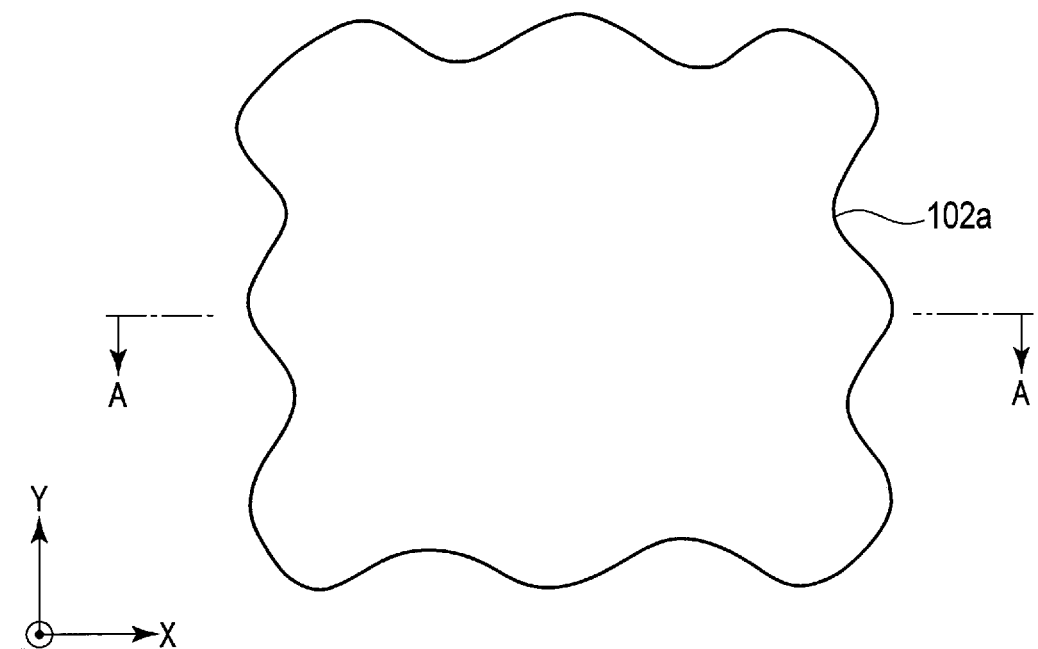
FIG. 2A is a top view which schematically illustrates a part of a manufacturing method of the semiconductor device according to the first embodiment.

In general, according to one embodiment, A semiconductor device includes: a first semiconductor layer; a plurality of first transistors including a plurality of first gate structures provided on the first semiconductor layer, a first channel region provided in the first semiconductor layer and under the first gate structure, and a plurality of first diffusion regions provided in the first semiconductor layer in a manner to sandwich the first channel region; an interlayer insulation film covering the first semiconductor layer and the plurality of first transistors; a first conductor provided in the interlayer insulation film and electrically connected to the first diffusion region; a second semiconductor layer provided on the interlayer insulation film; a plurality of second transistors including a plurality of second gate structures provided on the second semiconductor layer, a second channel region provided in the second semiconductor layer and under the second gate structure, and a plurality of second diffusion regions provided in the second semiconductor layer in a manner to sandwich the second channel region; and a second conductor provided in a through-hole penetrating the second semiconductor layer, and electrically connected to the first conductor and the second diffusion region, wherein the second diffusion region is provided also on an inner wall of the through-hole penetrating the second semiconductor layer.

Hereinafter, embodiments will be described with reference to the accompanying drawings. In the description below, structural elements having substantially the same functions and structures are denoted by like reference signs, and an overlapping description is given only where necessary. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

It should be noted that the drawings are schematic ones, and the relationship between a thickness and a planar dimension, the ratio in thickness between layers, etc. are different from real ones. Thus, concrete thicknesses and dimensions should be judged in consideration of descriptions below. Needless to say, the drawings include parts with mutually different relations or ratios of dimensions.

First Embodiment

<Configuration of Semiconductor Device According to First Embodiment>

Referring to FIG. 1A and FIG. 1B, a semiconductor device according to a first embodiment is described. FIG. 1A is a top view of the semiconductor device according to the first embodiment. FIG. 1B is a cross-sectional view taken along line A-A in FIG. 1A. Incidentally, in FIG. 1A, depiction of a semiconductor substrate 100, insulation films, etc. is omitted for the purpose of easier understanding of the configuration.

As illustrated in FIG. 1A and FIG. 1B, the semiconductor device according to the present embodiment includes a transistor formation region (also referred to as "lower-layer CMOS circuit" or the like) 1, and a transistor formation region (also referred to as "upper-layer CMOS circuit" or the like) 2, which is stacked on the transistor formation region 1 in a z-axis direction.

A gate insulation film 101, which extends in a y-axis direction, is provided on the semiconductor substrate 100. A gate electrode 102, which extends in the y-axis direction, is provided on the gate insulation film 101. Side-wall insulation films 103 are provided on the semiconductor substrate 100 and on side walls along the y-axis direction of the gate insulation film 101 and gate electrode 102. A structure, which includes a multilayer structure of the gate insulation film 101 and gate electrode 102 formed on the semiconductor substrate 100; the side-wall insulation films 103 provided on the side walls of the multilayer structure; a channel region formed in the semiconductor substrate 100 and under the multilayer structure; and source/drain regions 100a or 100b formed in the semiconductor substrate 100 and at positions sandwiching the channel region in an x-axis direction, is referred to as a transistor Tr1.

In addition, an interlayer insulation film 104 is formed in a manner to cover the transistor Tr1. Further, a contact plug 105, which connects the transistor formation region 1 and the transistor formation region 2 formed on the interlayer insulation film 104, is provided on the semiconductor substrate 100 and on the source/drain region 100b.

In the meantime, the region including at least the semiconductor substrate 100 and transistor Tr1 is referred to as "transistor formation region 1". In addition, an element isolation region (Shallow Trench Isolation: STI) 100c is provided in the semiconductor substrate 100, and electrically isolates neighboring transistors Tr1.

In addition, a semiconductor substrate 200 is formed on the interlayer insulation film 104. Further, a gate insulation film 201, which extends in the y-axis direction, is provided on the semiconductor substrate 200, and a gate electrode 202 extending in the y-axis direction is provided on the gate insulation film 201. A multilayer structure of the gate insulation film 201 and gate electrode 202 formed on the semiconductor substrate 200; a channel region formed in the semiconductor substrate 200 and under the multilayer structure; and source/drain regions 200a or 200b formed in the semiconductor substrate 200 and at positions sandwiching the channel region in the x-axis direction, are referred to as a transistor Tr2.

Besides, a through-hole is provided in the semiconductor substrate 200. In addition, a source/drain region 200b is formed in a region along the through-hole of the semiconductor substrate 200 and between the through-hole of the semiconductor substrate 200 and the channel region.

A contact plug 204 is provided in a manner to be in contact with the source/drain region 200b along the through-hole of the semiconductor substrate 200, and in contact with the contact plug 105.

The transistor formation region 1 and transistor formation region 2 are electrically connected via the contact plug 105 and contact plug 204. Such a connection technique using the contact plug 105 and contact plug 204 is also referred to as TV (Through Via) technology or the like.

Incidentally, in the above-described first embodiment, the description was given of the semiconductor substrate 200 using polygermanium (poly-Ge), but the embodiment is not limited to this. The semiconductor substrate 200 may be silicon (Si), polysilicon (poly-Si), amorphous silicon (a-Si), germanium (Ge), polygermanium (poly-Ge), amorphous germanium (a-Ge), germanium tin (GeSn), polygermanium tin (poly-GeSn), amorphous germanium tin (a-GeSn), or a compound thereof.

<Manufacturing Method of Semiconductor Device According to First Embodiment>

Next, referring to FIG. 1A and FIG. 1B to FIG. 16A and FIG. 16B, a description is given of a concrete example of the manufacturing method of the semiconductor device according to the first embodiment. FIG. 2A to FIG. 16A are top views which schematically illustrate parts of the manufacturing method of the semiconductor device according to the first embodiment. FIG. 2B to FIG. 16B are cross-sectional view taken along lines A-A in FIG. 2A to FIG. 16A. Incidentally, in FIG. 2B to FIG. 16B, depiction of the semiconductor substrate 100, insulation films, etc. is omitted for the purpose of easier understanding of the configuration.

Figure 2B:
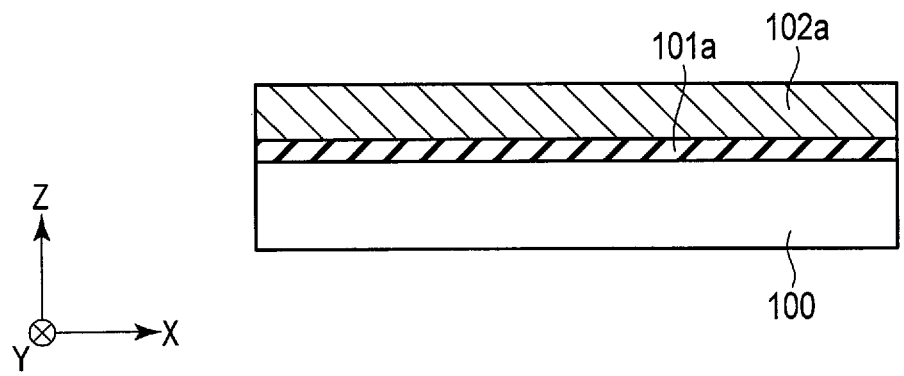
FIG. 2B is a cross-sectional view taken along line A-A in FIG. 2A.

As illustrated in FIG. 2A and FIG. 2B, a silicon oxide film of an oxide film 101a is formed by exposing, in an oxygen atmosphere of, e.g. several-hundred degrees, the surface of a silicon substrate which becomes a semiconductor substrate (silicon substrate) 100 doped with desired impurities. In addition, a polysilicon film 102a is formed by, e.g. CVD on the oxide film 101a. Subsequently, a resist (not shown) or the like, which serves as a mask film for pattering, is formed on the polysilicon film 102a.

Figure 3A:
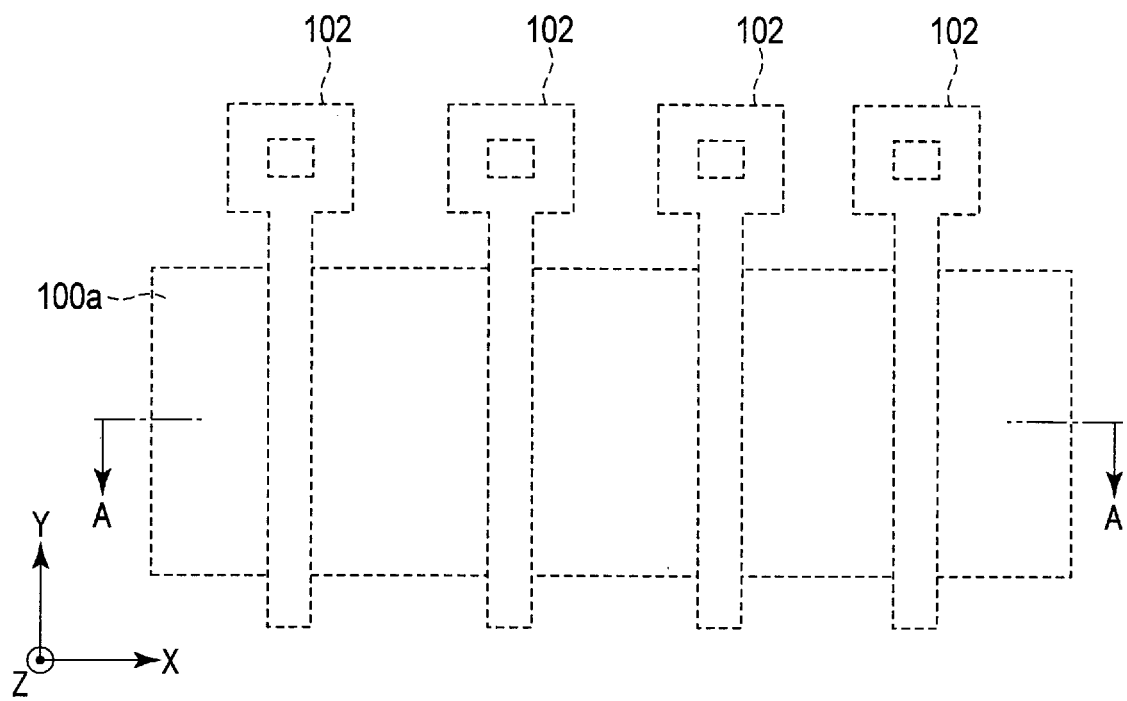
FIG. 3A is a top view which schematically illustrates a part of the manufacturing method of the semiconductor device according to the first embodiment.
Figure 3B:
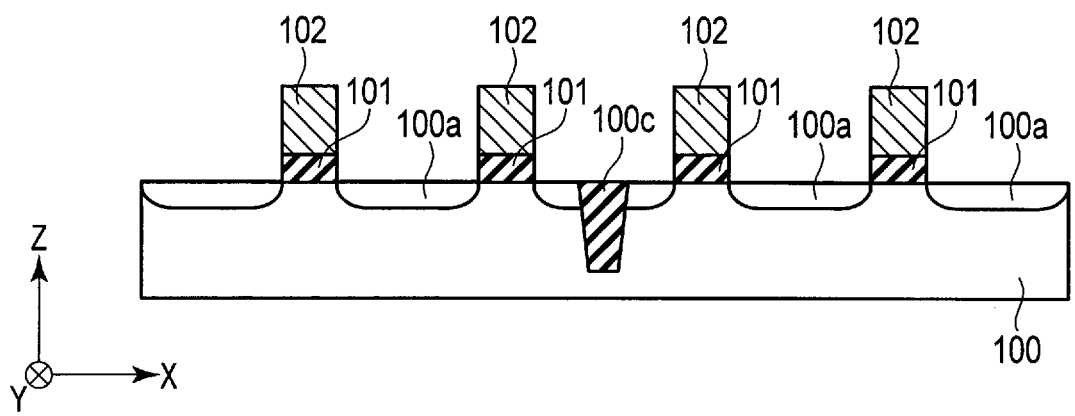
FIG. 3B is a cross-sectional view taken along line A-A in FIG. 3A.

Next, as illustrated in FIG. 3A and FIG. 3B, by RIE (reactive ion etching) using the mask film (not shown), the polysilicon film 102a and oxide film 101a are successively etched, and a gate structure including a gate insulation film 101 and a gate electrode 102 is formed. Thereafter, for example, an impurity element, such as arsenic, is ion-implanted in a surface region of the semiconductor substrate 100, and heat treatment is performed at about 1000° C. Thereby, as illustrated in FIG. 3A and FIG. 3B, a first source/drain region 100a is formed. This gate structure extends in the y-axis direction. In addition, a contact region of the gate electrode 102 is formed on an outside of the first source/drain region 100a.

Figure 4A:
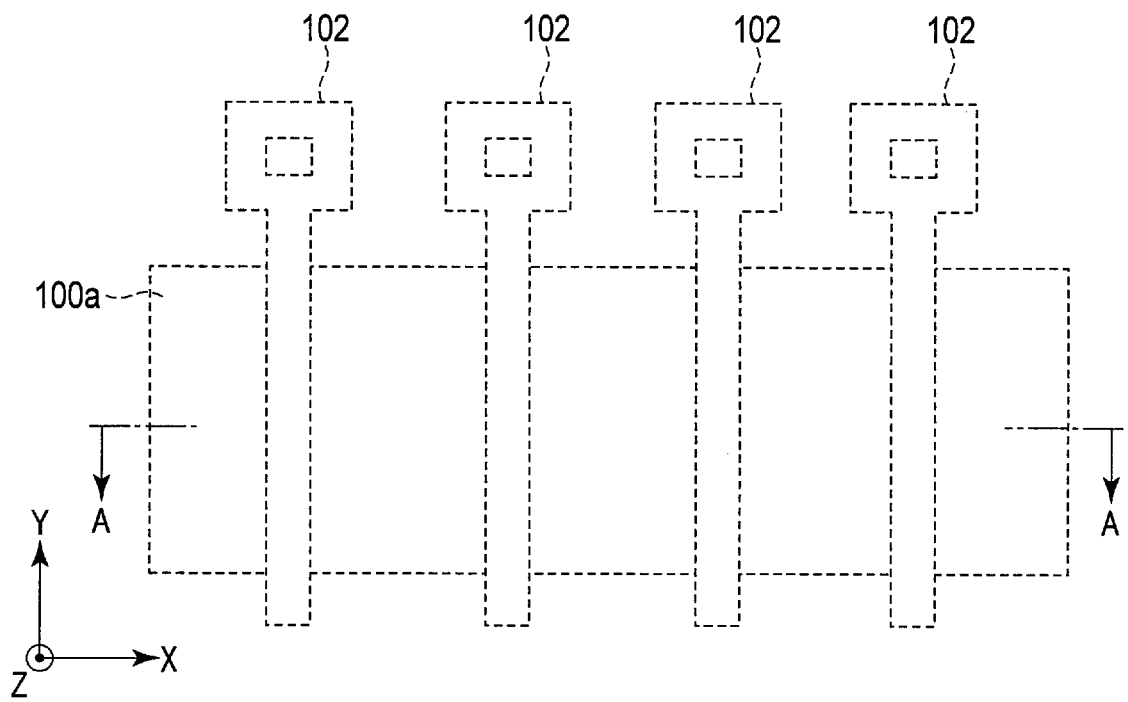
FIG. 4A is a top view which schematically illustrates a part of the manufacturing method of the semiconductor device according to the first embodiment.
Figure 4B:
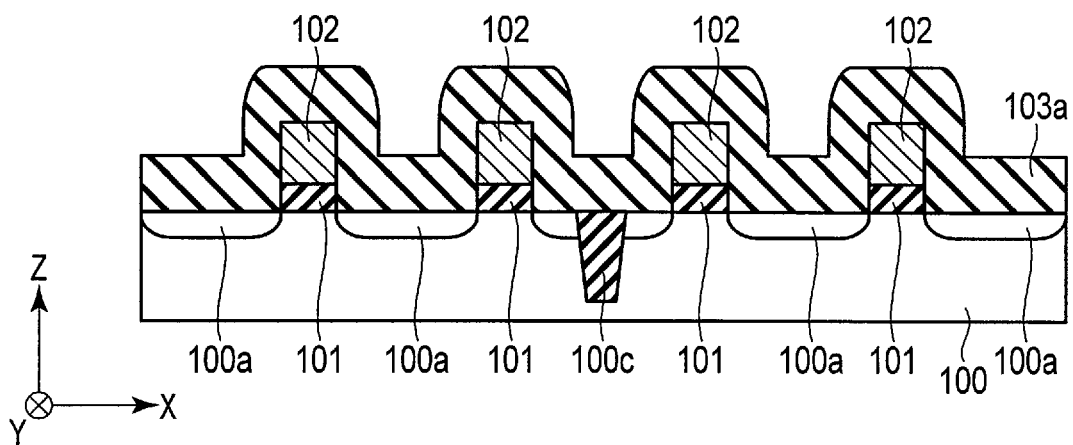
FIG. 4B is a cross-sectional view taken along line A-A in FIG. 4A.

Next, as illustrated in FIG. 4A and FIG. 4B, a silicon nitride film 103a is deposited on the entire surface, for example, by CVD or the like.

Figure 5A:
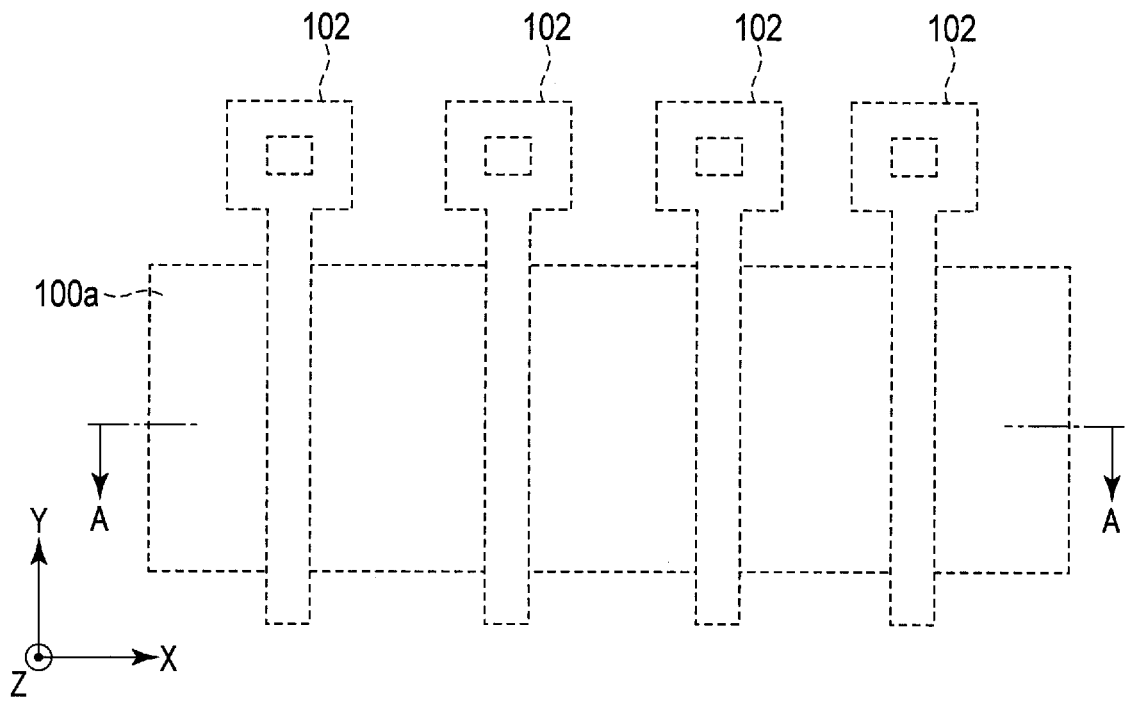
FIG. 5A is a top view which schematically illustrates a part of the manufacturing method of the semiconductor device according to the first embodiment.
Figure 5B:
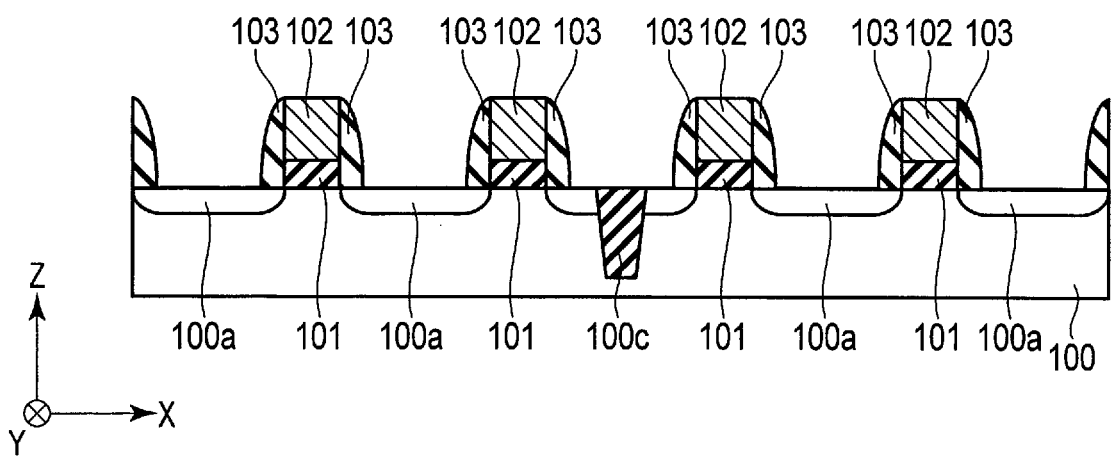
FIG. 5B is a cross-sectional view taken along line A-A in FIG. 5A.

Then, as illustrated in FIG. 5A and FIG. 5B, by performing anisotropic etching such as RIE, side-wall insulation films 103 are formed on the semiconductor substrate 100, and on the side walls of the gate electrode 102 and side walls of the gate insulation film 101 along the y-axis direction.

Figure 6A:
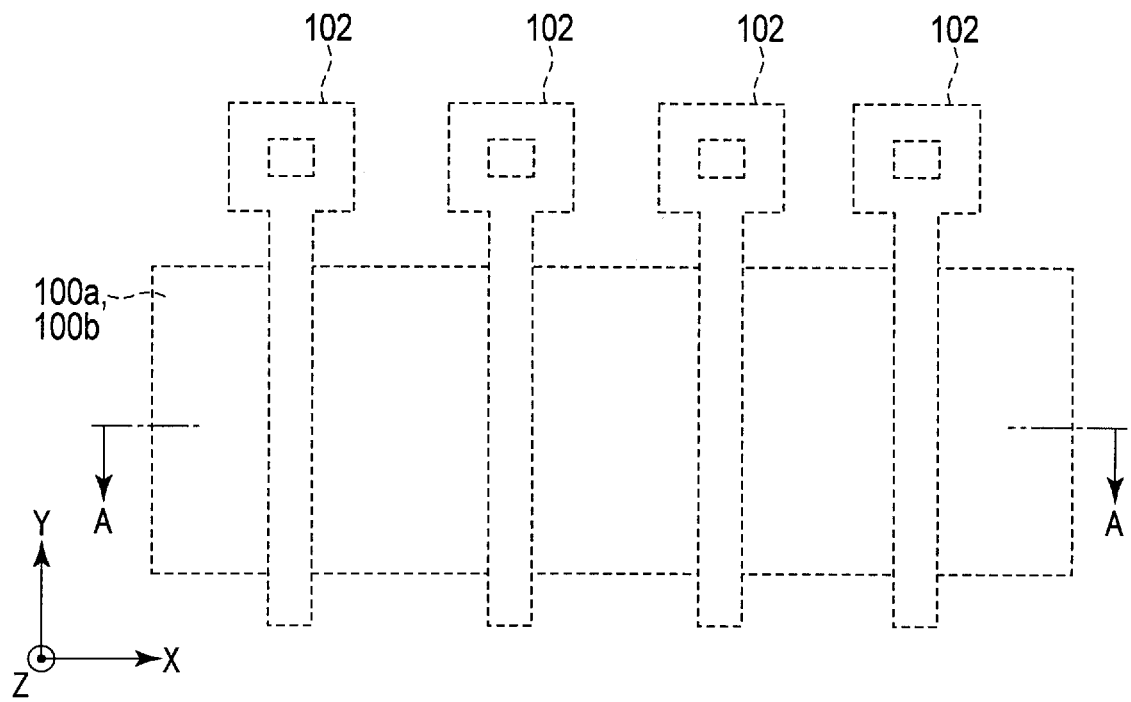
FIG. 6A is a top view which schematically illustrates a part of the manufacturing method of the semiconductor device according to the first embodiment.
Figure 6B:
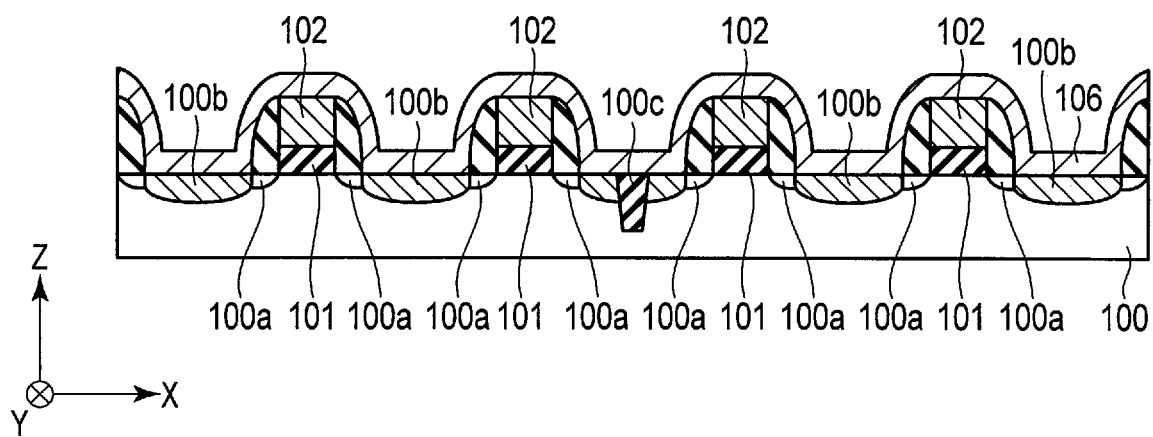
FIG. 6B is a cross-sectional view taken along line A-A in FIG. 6A.

Next, as illustrated in FIG. 6A and FIG. 6B, a semiconductor-metal compound material metallic film (metal-semiconductor compound) 106, such as nickel (Ni), is formed on the entire surface. Thereafter, heat treatment is performed, thereby forming a semiconductor-metal compound film, which becomes a second source/drain region 100b, on that surface of the semiconductor substrate 100, which is not covered with the transistor structure. Thereby, a transistor Tr1 including the gate electrode 102, gate insulation film 101, side-wall insulation film 103 and source/drain region is formed.

As illustrated in FIG. 7A and FIG. 7B, after the semiconductor-metal compound film was formed on the surface of the semiconductor substrate 100, unreacted nickel (Ni) is removed by hydrogen chloride (HCL) solution treatment. Then, an interlayer insulation film 104 is deposited on the entire surface, and the surface of the interlayer insulation film 104 is planarized by CMP. Thus, the transistor formation region 1 is formed.

Figure 8A:
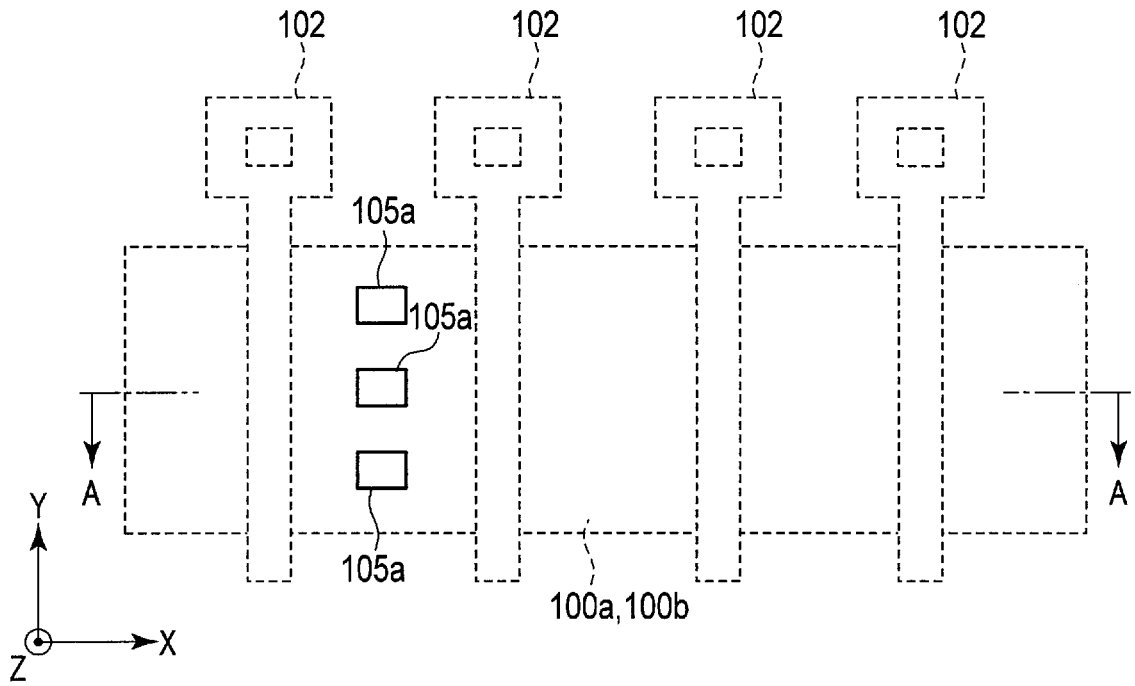
FIG. 8A is a top view which schematically illustrates a part of the manufacturing method of the semiconductor device according to the first embodiment.
Figure 8B:
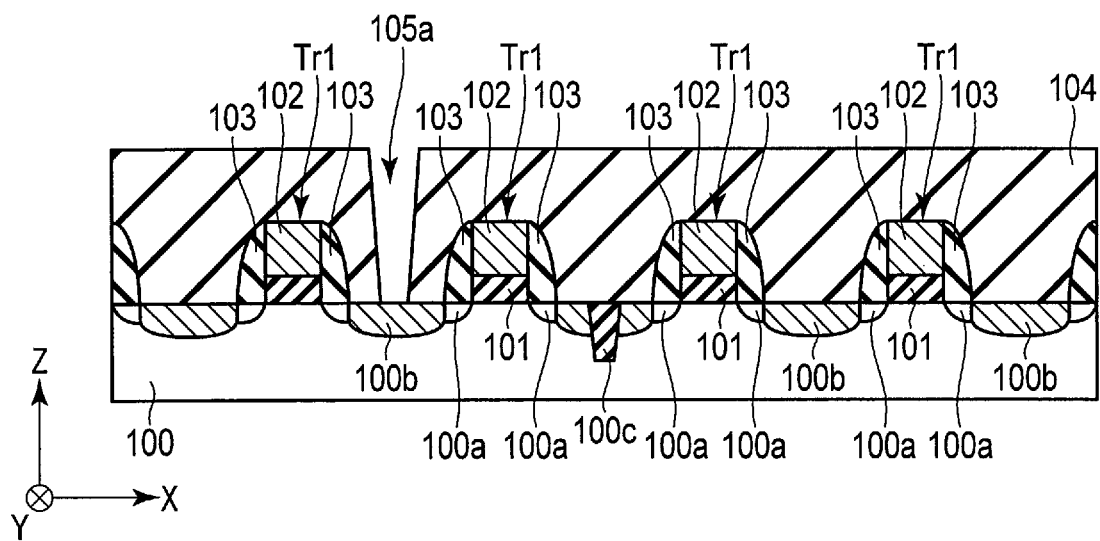
FIG. 8B is a cross-sectional view taken along line A-A in FIG. 8A.

Next, as illustrated in FIG. 8A and FIG. 8B, the interlayer insulation film 104 formed above the source/drain region 100b, which is connected to the contact plug, is etched by using RIE (Reactive Ion Etching), and a through-hole 105a, which becomes a contact plug formation region, is formed.

Then, as illustrated in FIG. 9A and FIG. 9B, as a conductive layer 105b which becomes a contact plug, Cu is formed in the through-hole 105a via, for example, tungsten or a barrier metal. Incidentally, this barrier metal is, for instance, titanium nitride or tantalum nitride.

Next, as illustrated in FIG. 10A and FIG. 10B, the conductive layer 105b, which is formed on the interlayer insulation film 104, is removed by CMP, and a contact plug 105 is left in the through-hole 105a. Thereafter, an amorphous germanium (a-Ge) layer with a thickness of, e.g. about 30 nm, which becomes a semiconductor substrate (semiconductor layer) 200, is formed on the interlayer insulation film 104 and contact plug 105 by CVD or sputtering.

Subsequently, as illustrated in FIG. 11A and FIG. 11B, anneal is performed at about 400° C., and the amorphous germanium layer is made into a polycrystal. Then, the semiconductor substrate 200 is etched in an island shape by mesa-etching. This island-shaped semiconductor substrate 200 becomes an active region by subsequent fabrication steps. At the time of this etching step, a through-hole 204a is formed at a location where the contact plug 105 exists.

As illustrated in FIG. 12A and FIG. 12B, an alumina oxide ($Al_2O_3$) with a thickness of about 4 nm or a hafnium alumina oxide (HfAlO) with a thickness of about 7 nm is formed as an insulation film, which becomes a gate insulation film, on the semiconductor substrate 200 by ALD at about 250° C. Then, a tantalum nitride (TaN) film 202a with a thickness of about 30 nm is deposited by sputtering film formation on the insulation film 201a. Subsequently, a resist (not shown) or the like, which serves as a mask film for pattering, is formed on the tantalum nitride film 202a.

As illustrated in FIG. 13A and FIG. 13B, by RIE using the mask film (not shown), the tantalum nitride film 202a and insulation film 201a are successively etched, and thereby a gate structure of the transistor Tr2 including a gate insulation film 201 and a gate electrode 202 is formed. At this time, the tantalum nitride film 202a and insulation film 201a in the through-hole 204a are removed by the RIE.

Subsequently, as illustrated in FIG. 14A and FIG. 14B, nickel (Ni) is deposited on that area of the semiconductor substrate 200, which is not covered with the gate structure, and in the through-hole 204a. Then, by performing RTA at 350° C. for one minute, a semiconductor-metal compound (germanide) film (nickel germanium: NiGe), which becomes a source/drain region 200a, is formed in the semiconductor substrate 200.

In addition, since nickel (Ni) is buried also in the through-hole 204a, a semiconductor-metal compound (germanide)

film (nickel germanium: NiGe), which becomes a source/drain region 200b, is also formed in the through-hole 204a of the semiconductor substrate 200.

Thereby, a transistor Tr2 including the gate electrode 202, gate insulation film 201 and source/drain region is formed.

In the meantime, if the source/drain region 100b, which is a silicide film formed in the first transistor formation region 1, is annealed at temperatures of about 500° C., there is a case in which the source/drain region 100b deteriorates. However, the temperature at the time of anneal in this silicide formation step is about 350° C.

Thus, no deterioration occurs in the quality of the source/drain region 100b which is the silicide film formed in the first transistor formation region 1.

Figure 15A:
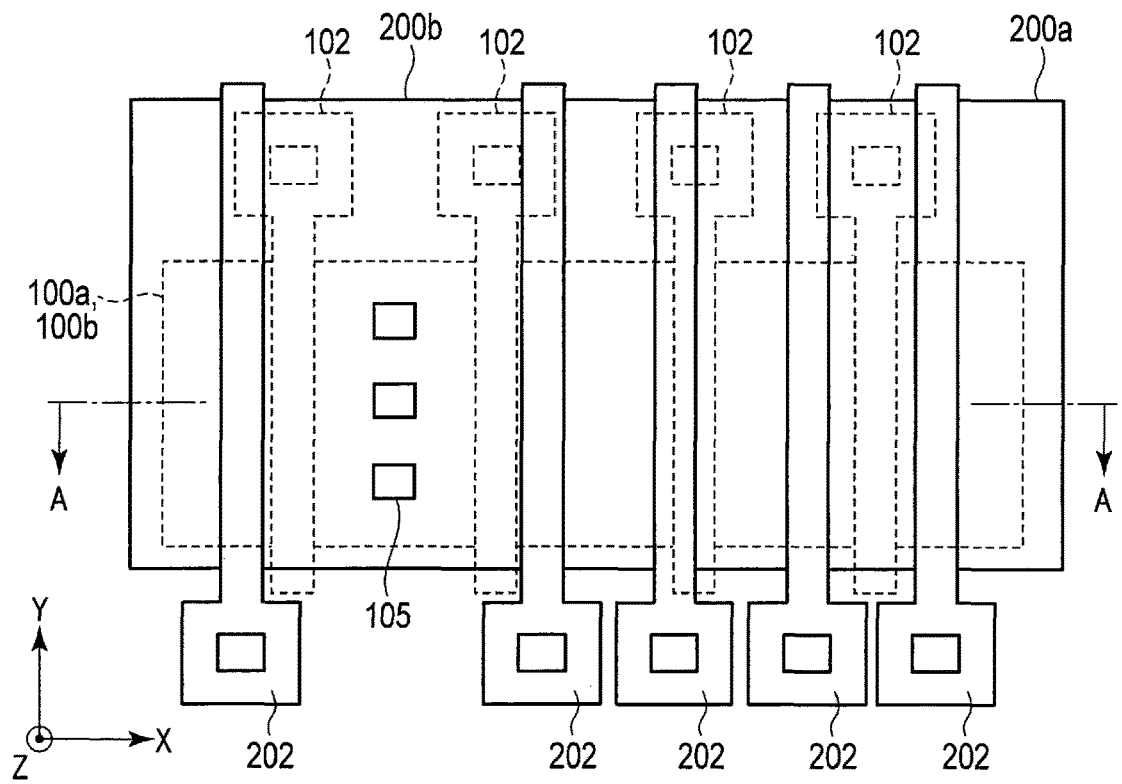
FIG. 15A is a top view which schematically illustrates a part of the manufacturing method of the semiconductor device according to the first embodiment.
Figure 15B:
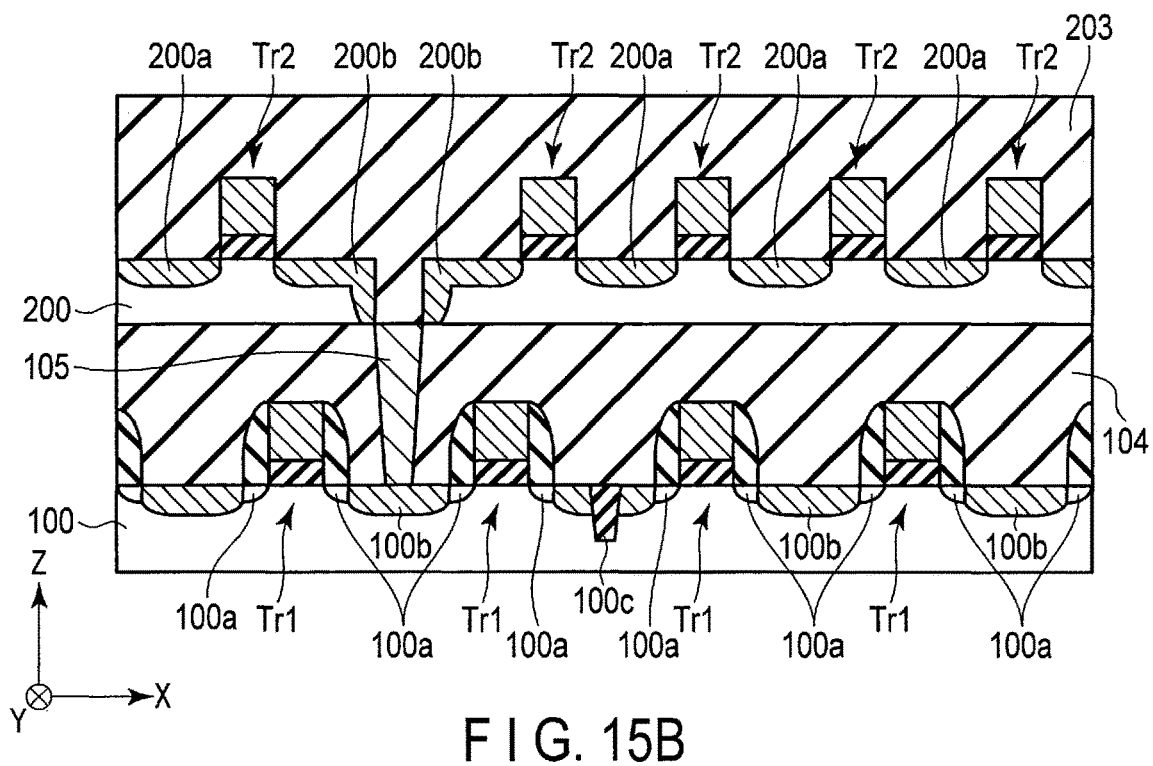
FIG. 15B is a cross-sectional view taken along line A-A in FIG. 15A.

As illustrated in FIG. 15A and FIG. 15B, unreacted nickel (Ni) is removed by using hydrogen chloride (HCL) solution. Then, a silicon oxide film is deposited as an interlayer insulation film 203 on the entire surface, and the surface of the interlayer insulation film 203 is planarized by CMP.

As illustrated in FIG. 16A and FIG. 16B, the interlayer insulation film 203 provided in the through-hole 204a and the interlayer insulation film 203 formed above the through-hole 204a are etched by using RIE, and a through-hole 204b, which becomes a contact plug formation region, is formed.

Then, as illustrated in FIG. 1A and FIG. 1B, as a conductive layer, Cu is formed in the through-hole 204b via, for example, tungsten or a barrier metal. In addition, by removing the polysilicon formed on the interlayer insulation film 203 by CMP, a contact plug 204 is formed in the through-hole 204b.

Figure 17:
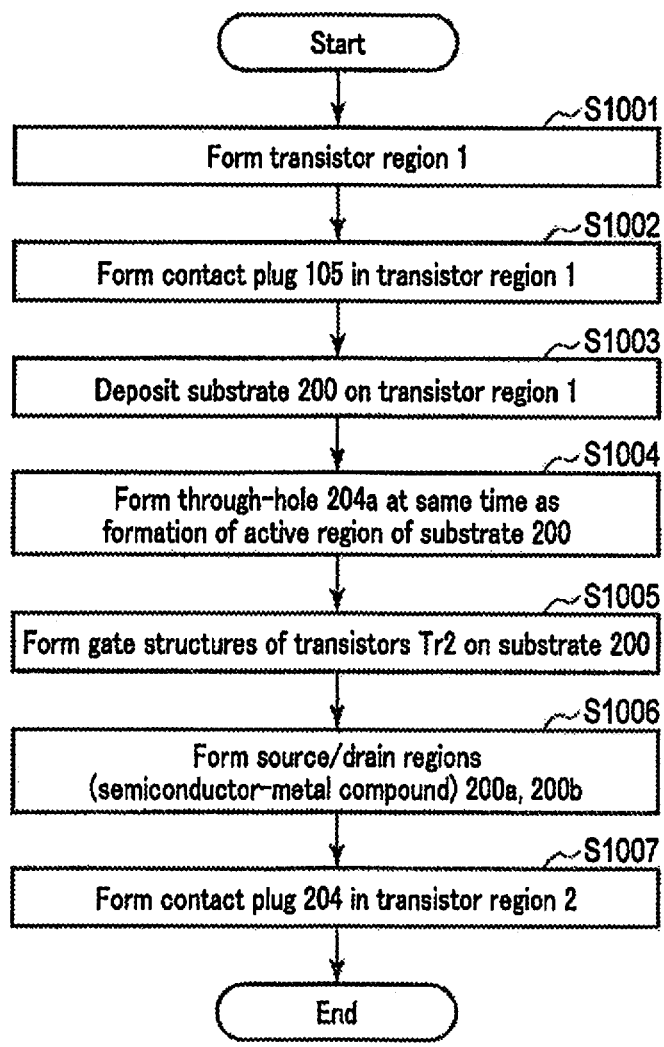
FIG. 17 is a flowchart illustrating a basic manufacturing method of the semiconductor device according to the first embodiment.

Next, referring to FIG. 1A and FIG. 1B through FIG. 17, a flow of a basic manufacturing method of a first semiconductor device is generally described. FIG. 17 is a flowchart illustrating the basic manufacturing method of the first semiconductor device.

[Step S1001]
To begin with, a first transistor formation region 1 is formed.

[Step S1002]
Subsequently, a contact plug 105 is formed in the transistor formation region 1 and on the second source/drain region 100b in the semiconductor substrate 100 of the transistor formation region 1.

[Step S1003]
Amorphous germanium, which becomes a semiconductor substrate 200, is deposited on the first transistor formation region 1. Further, the amorphous germanium is crystallized by anneal or the like, and polygermanium is formed.

[Step S1004]
The semiconductor substrate 200 is etched in an island structure which becomes an active region, and at the same time a through-hole 204a, which penetrates to the contact plug 105, is formed in the semiconductor substrate 200.

[Step S1005]
A transistor Tr2 is formed on the semiconductor substrate 200.

[Step S1006]
Germanide films, which become source/drain regions 200a and 200b, are formed between channel regions of mutually neighboring transistors Tr2 of the semiconductor substrate 200 and in the through-hole 204a. Specifically, as described with reference to FIG. 14A and FIG. 14B, the germanide films are formed by reacting the semiconductor substrate 200 with nickel (Ni) which is a silicide material.

[Step S1007]
A contact plug 204, which is connected to the contact plug 105 and source/drain region 200b, is formed in the second transistor formation region 2. Thereafter, a predetermined process is performed, and thereby the semiconductor device is manufactured.

Comparative Example

Figure 18A:
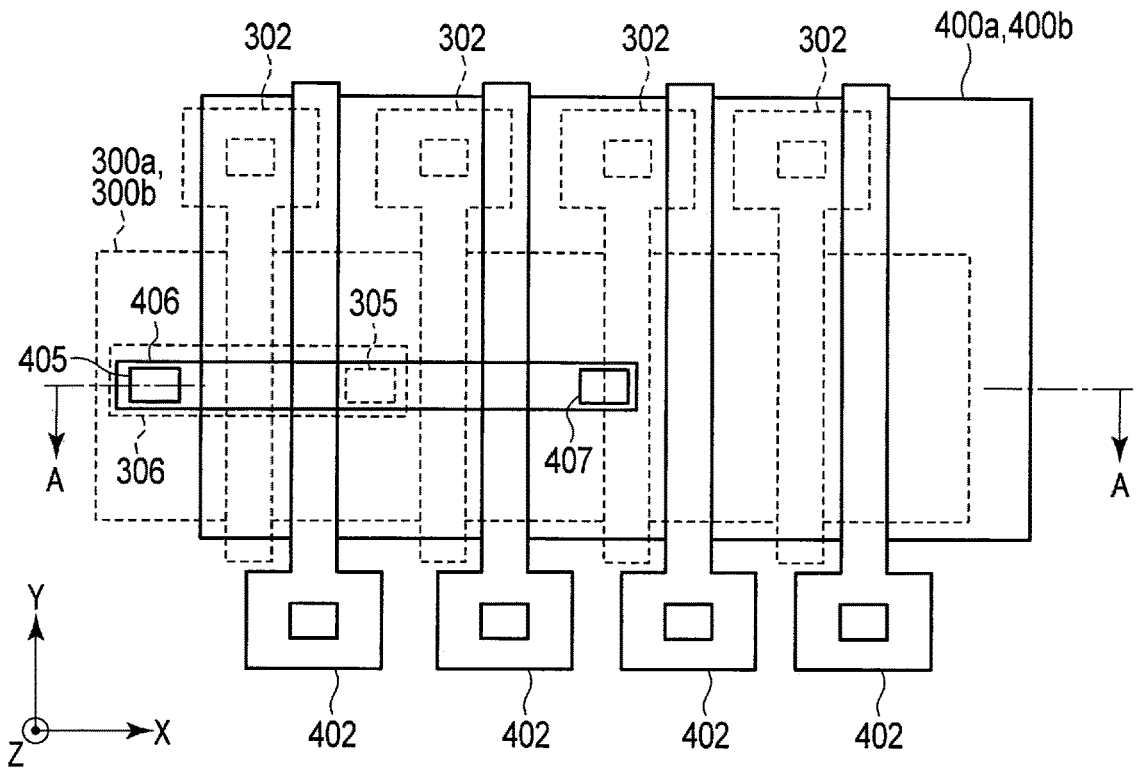
FIG. 18A is a top view of a semiconductor device according to a comparative example.
Figure 18B:
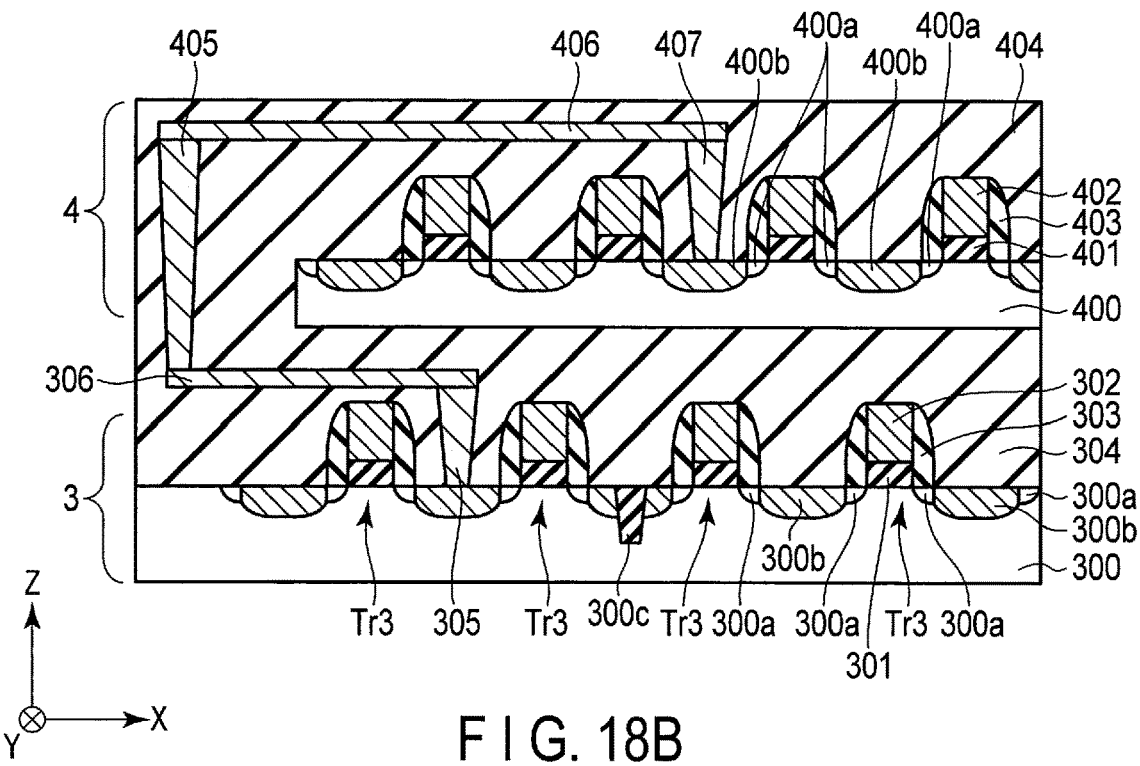
FIG. 18B is a cross-sectional view taken along line A-A in FIG. 18A.

Next, referring to FIG. 18A and FIG. 18B, a comparative example relating to the present embodiment is described. FIG. 18A is a top view of a semiconductor device according to the comparative example. FIG. 18B is a cross-sectional view taken along line A-A in FIG. 18A. Incidentally, in FIG. 18A, depiction of a semiconductor substrate 300, insulation films, etc. is omitted for the purpose of easier understanding of the configuration.

As illustrated in FIG. 18A and FIG. 18B, a lower-layer transistor formation region 3 and an upper-layer transistor formation region 4, which is formed on the lower-layer transistor formation region 3, are connected via a wiring layer 306 extending to a region where the upper-layer transistor formation region 4 is not formed; a contact plug 405 which is connected to the wiring layer 306; a wiring layer 406 which is connected to the contact plug 405 and extends to a region where the upper-layer transistor formation region 4 is not formed; and a contact plug 407 connected to the wiring layer 406.

In the present comparative example, in a case where the upper-layer transistor formation region 4 is larger than the lower-layer transistor formation region 3, the lengths of the wiring layers 306 and 307, which extend to the region where the upper-layer transistor formation region 4 is not formed, become greater, and an area penalty occurs.

Advantageous Effects of First Embodiment

In the above-described first embodiment, the first transistor formation region 1 and second transistor formation region 2 are connected by the contact plug 105 and contact plug 204 using TV (Through Via) technology. In addition, in the second transistor formation region 2 formed on the first transistor formation region 1, the source/drain region is formed in the opening portion in which the contact plug 204 is formed.

According to the semiconductor device of the first embodiment, since the contact area between the contact plug 204 and the source/drain region 200b of the semiconductor substrate 200 is large, the parasitic resistance is reduced, and the enhancement in performance and the reduction in power consumption of the multilayer semiconductor device are realized.

In addition, even in the case where the second transistor formation region 2 is larger than the first transistor formation region 1, there occurs no area penalty for the connection between the second transistor formation region 2 and first transistor formation region 1, and therefore the wiring length is minimized. In addition, such a top-view rule is needless that the second transistor formation region 2 is made smaller than the first transistor formation region 1, and the degree of freedom of design increases.

In realizing the enhancement in performance and the reduction in power consumption of the semiconductor integrated circuit, it is effective to reduce the parasitic capacitance/parasitic resistance by reducing the wiring length by three-dimensional multiple layers of the transistor.

Furthermore, in the above first embodiment, as the second semiconductor substrate 200 of the second transistor formation region 2, use is made of the polygermanium which enables formation of the source/drain region at such temperatures as not to cause damage to the source/drain region 100b of the first transistor formation region 1.

For example, it is thinkable to attach a second transistor formation region 2, which is separately formed by using Si, onto the first transistor formation region 1, and to connect the first transistor formation region 1 and second transistor formation region 2 by TSV (Through Silicon Via) technology. However, when the second transistor formation region 2 is attached onto the first transistor formation region 1, there is a problem of the precision of alignment, and it is difficult to precisely attach the second transistor formation region 2 at a predetermined position. As a result, when the separately fabricated second transistor formation region 2 is attached onto the first transistor formation region 1, and the first transistor formation region 1 and second transistor formation region 2 are connected by TSV technology, there are size limitations which depend on the size of TSV and the precision in alignment. Meanwhile, such a method is thinkable that a Si substrate is attached onto the first transistor formation region 1, and thereafter the second transistor formation region is formed. However, when the source/drain region is formed by ion-implanting impurities in the second transistor formation region, it is necessary to activate the impurities by anneal at temperatures of about 1000° C. In this case, a silicide film, which is formed in the first transistor formation region 1, deteriorates.

However, in the manufacturing method of the semiconductor device according to the above-described first embodiment, the source/drain region of the second transistor formation region 2 can be formed at such low temperatures as not to degrade the silicide. Therefore, the second transistor formation region 2, which is connected to the first transistor formation region 1 by the TV, can be formed without degrading the first transistor formation region.

In addition, in the above-described first embodiment, before the silicide is formed in the semiconductor substrate 200, the through-hole, in which the contact plug 204 is formed, is formed in the semiconductor substrate 200 at the same time as the active region of the semiconductor substrate 200 is patterned.

Thus, there is no need to divide the contact hole lithography and contact hole etching, this contributing to simplification of the process and reduction in cost.

Second Embodiment

Next, a second embodiment is described. The second embodiment differs from the first embodiment with respect to the material of the semiconductor substrate 200, and the method of forming the semiconductor substrate 200. Incidentally, in the second embodiment, the structural elements having substantially the same functions and structures as in the above-described first embodiment are denoted by like reference numerals, and an overlapping description is given only where necessary.

<Semiconductor Device According to Second Embodiment>

In a semiconductor device according to the second embodiment, used is made of, as the semiconductor substrate 200, gallium arsenic (GaAs), indium gallium arsenic (InGaAs), indium arsenic (InAs), indium phosphorus (InP), indium antimony (InSb), indium gallium phosphorus (InGaP), gallium antimony (GaSb), gallium phosphorus (GaP), or a compound thereof.

<Manufacturing Method of Semiconductor Device According to Second Embodiment>

Figure 19:
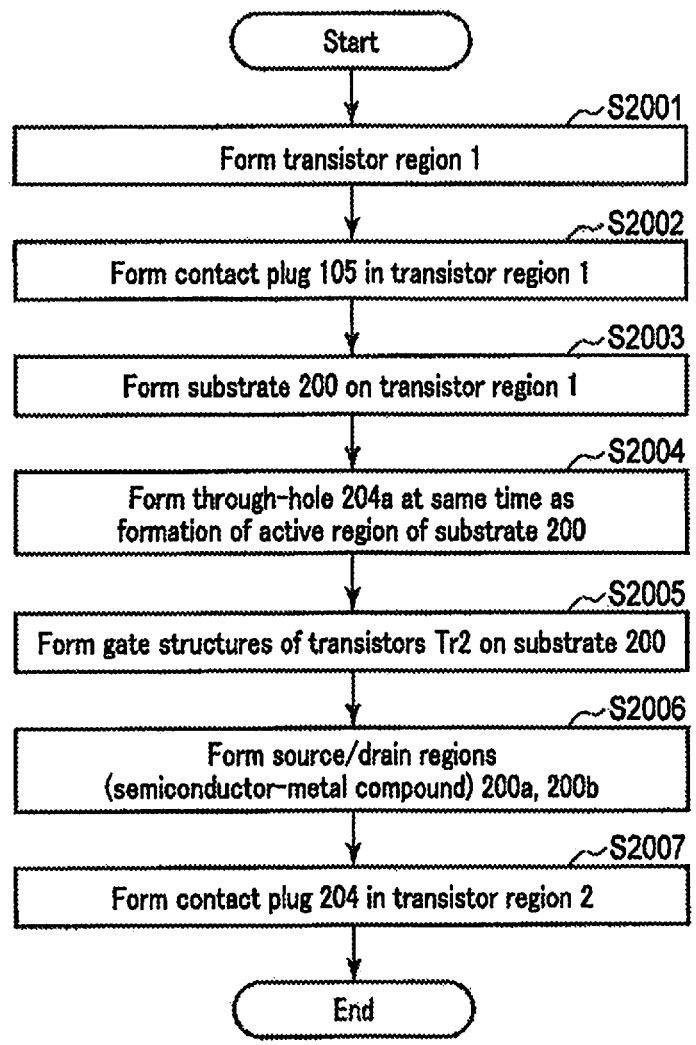
FIG. 19 is a flowchart illustrating a basic manufacturing method of a semiconductor device according to a second embodiment.

Next, referring to FIG. 19, a flow of a basic manufacturing method of a second semiconductor device is generally described. FIG. 19 is a flowchart illustrating the basic manufacturing method of the second semiconductor device.

[Step S2001]

To begin with, a first transistor formation region 1 is formed.

[Step S2002]

Subsequently, a contact plug 105 is formed in the transistor formation region 1 and on the second source/drain region 100b in the semiconductor substrate 100 of the transistor formation region 1.

[Step S2003]

An indium gallium arsenic (InGaAs) substrate, which becomes a semiconductor substrate 200, is attached onto the first transistor formation region 1.

[Step S2004]

The semiconductor substrate 200 is etched in an island structure which becomes an active region, and at the same time a through-hole 204a, which penetrates to the contact plug 105, is formed in the semiconductor substrate 200.

[Step S2005]

A gate structure of a transistor Tr2 is formed on the semiconductor substrate 200.

[Step S2006]

Metal-InGaAs alloy films, which become source/drain regions 200a and 200b, are formed between channel regions of mutually neighboring transistors Tr2 and in the through-hole 204a. Specifically, by the same method as described with reference to FIG. 14A and FIG. 14B, the metal-InGaAs alloy (Ni—InGaAs alloy) films are formed.

[Step S2007]

A contact plug 204, which is connected to the contact plug 105 and source/drain region 200b, is formed in the transistor formation region 2. Thereafter, a predetermined process is performed, and thereby the semiconductor device is manufactured.

Advantageous Effects of Second Embodiment

In the above-described second embodiment, the semiconductor substrate 200 is formed by attaching the indium gallium arsenic (InGaAs) substrate or the like onto the first transistor formation region 1. In addition, like the above-described first embodiment, the source/drain region of the second transistor formation region 2 can be formed at such temperatures as not to degrade the silicide film of the first transistor formation region 1.

Thereby, according to the semiconductor device of the second embodiment, the same advantageous effects as with the semiconductor device of the above-described first embodiment can be obtained.

Third Embodiment

Next, a third embodiment is described. The third embodiment differs from the first embodiment and second embodiment with respect to the material of the semiconductor substrate 200, and the method of forming the semiconductor substrate 200. Incidentally, in the third embodiment, the structural elements having substantially the same functions and structures as in the above-described first embodiment are denoted by like reference numerals, and an overlapping description is given only where necessary.

\<Semiconductor Device According to Third Embodiment\>

In a semiconductor device according to the third embodiment, an oxide semiconductor, such as zinc oxide (ZnO) or indium gallium zinc oxide (InGaZnO), is used as the semiconductor substrate 200.

\<Manufacturing Method of Semiconductor Device According to Third Embodiment\>

Next, referring to FIG. 20, FIG. 21A and FIG. 21B, a flow of a basic manufacturing method of a third semiconductor device is generally described. FIG. 20 is a flowchart illustrating a basic manufacturing method of the third semiconductor device. FIG. 21A is a top view which schematically illustrates a part of the manufacturing method of the semiconductor device according to the third embodiment. FIG. 21B is a cross-sectional view taken along line A-A in FIG. 21A. Incidentally, in FIG. 21B, depiction of the semiconductor substrate 100, insulation films, etc. is omitted for the purpose of easier understanding of the configuration.

[Step S3001]

To begin with, a first transistor formation region 1 is formed.

[Step S3002]

Subsequently, a contact plug 105 is formed in the transistor formation region 1 and on the second source/drain region 100$b$ in the semiconductor substrate 100 of the transistor formation region 1.

[Step S3003]

Indium gallium zinc oxide (InGaZnO), which becomes a semiconductor substrate 200, is deposited on the first transistor formation region 1.

[Step S3004]

The semiconductor substrate 200 is etched in an island structure which becomes an active region, and at the same time a through-hole 204$a$, which penetrates to the contact plug 105, is formed in the semiconductor substrate 200.

[Step S3005]

A gate structure of a transistor Tr2 is formed on the semiconductor substrate 200.

[Step S3006]

As illustrated in FIG. 21A and FIG. 21B, the oxygen (O) in that region of the semiconductor substrate 200, which is not covered with the gate structure, and in the through-hole 204$a$, is removed by a deoxidation process. Thereby, a source/drain region 200$a$ (oxygen-deficient indium gallium zinc oxide: InGaZnO) is formed in the semiconductor substrate 200.

In addition, since the oxygen in the through-hole 204$a$ is removed, a source/drain region 200$b$ (oxygen-deficient indium gallium zinc oxide: InGaZnO) is also formed in the through-hole 204$a$ of the semiconductor substrate 200.

In the meantime, if the source/drain region 100$b$, which is the silicide film formed in the first transistor formation region 1, is annealed at temperatures of about 500° C., there would be a case in which the source/drain region 100$b$ deteriorates. However, the temperature at the time of anneal in this deoxidation process is less than 500° C. Thus, the quality of the source/drain region 100$b$, which is the silicide film formed in the first transistor formation region 1, does not deteriorate.

[Step S3007]

A contact plug 204, which is connected to the contact plug 105 and source/drain region 200$b$, is formed in the transistor formation region 2. Thereafter, a predetermined process is performed, and thereby the semiconductor device is manufactured.

\<Advantageous Effects of Third Embodiment\>

In the above-described third embodiment, the semiconductor substrate 200 is formed by depositing an oxide, such as indium gallium zinc oxide (InGaZnO), on the first transistor formation region 1. In addition, the source/drain region of the second transistor formation region 2 can be formed by performing the deoxidation process at such temperatures as not to degrade the silicide film of the first transistor formation region 1.

Thereby, according to the semiconductor device of the third embodiment, the same advantageous effects as with the semiconductor device of the above-described first embodiment can be obtained.

(Modifications, Etc.)

In the meantime, in the above-described embodiments, the structure and manufacturing method of the first transistor formation region 1 are not limited to the above-described structure and manufacturing method, and various modifications are possible.

In addition, in the above embodiments, in the first transistor formation region and second transistor formation region, the gate electrode of each transistor extends in the y-axis direction. However, aside from this, various modifications are possible.

Figure 22:
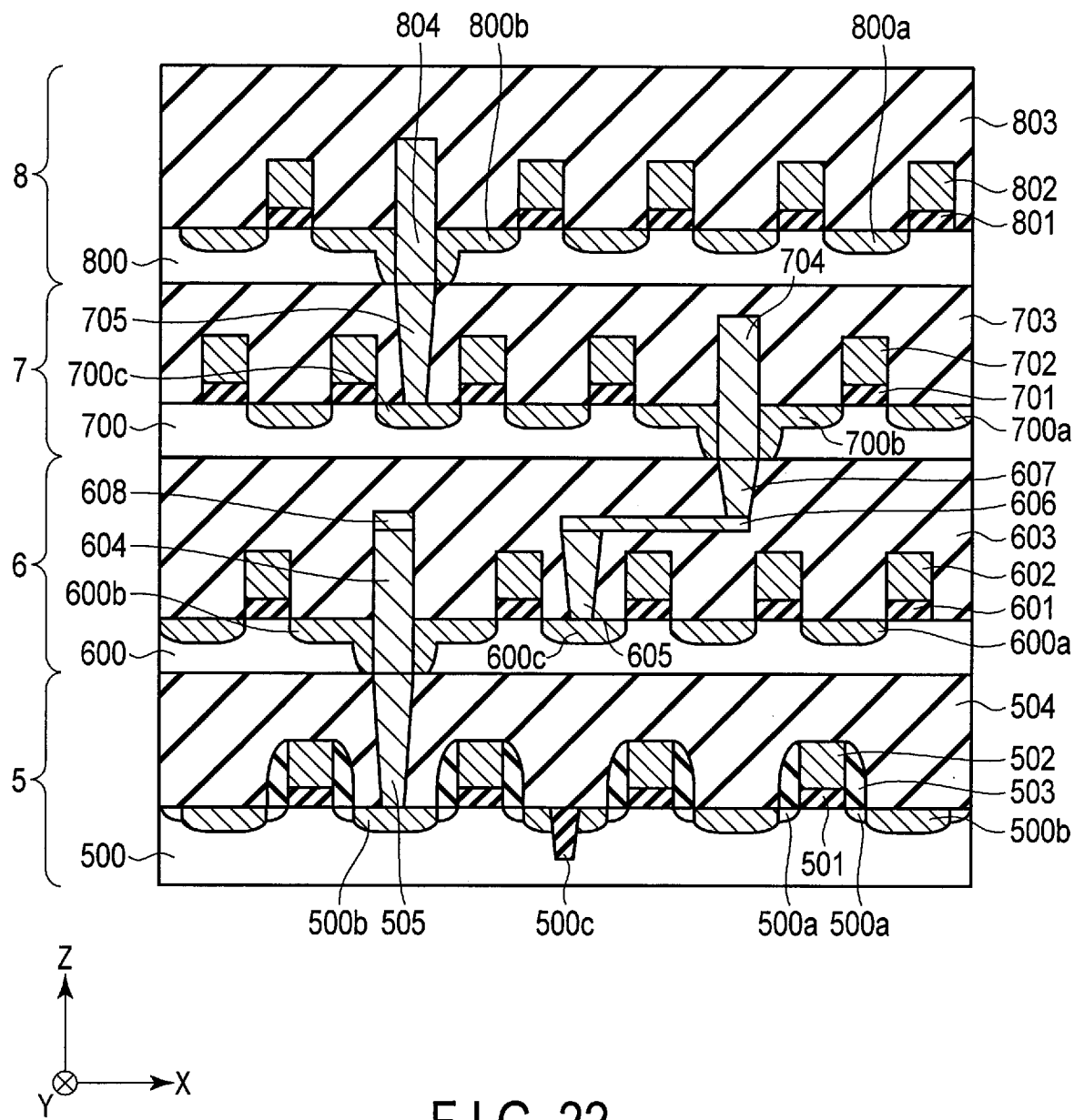
FIG. 22 is a cross-sectional view of a semiconductor device according to a modification.

Additionally, in the above-described embodiments, the case was described in which the second transistor formation region is formed on the first transistor formation region, but the embodiments are not limited to this case. For example, as illustrated in FIG. 22, such a configuration may be adopted that a fifth transistor formation region 5, a sixth transistor formation region 6, a seventh transistor formation region 7, and an eighth transistor formation region 8 are successively stacked. In this case, too, the upper-layer transistor formation regions, which are above the lowermost-layer fifth transistor formation region 5, may be fabricated by the same material and method as described in the above embodiments. Thereby, the same advantageous effects as in the above embodiments can be obtained.

Figure 23A:
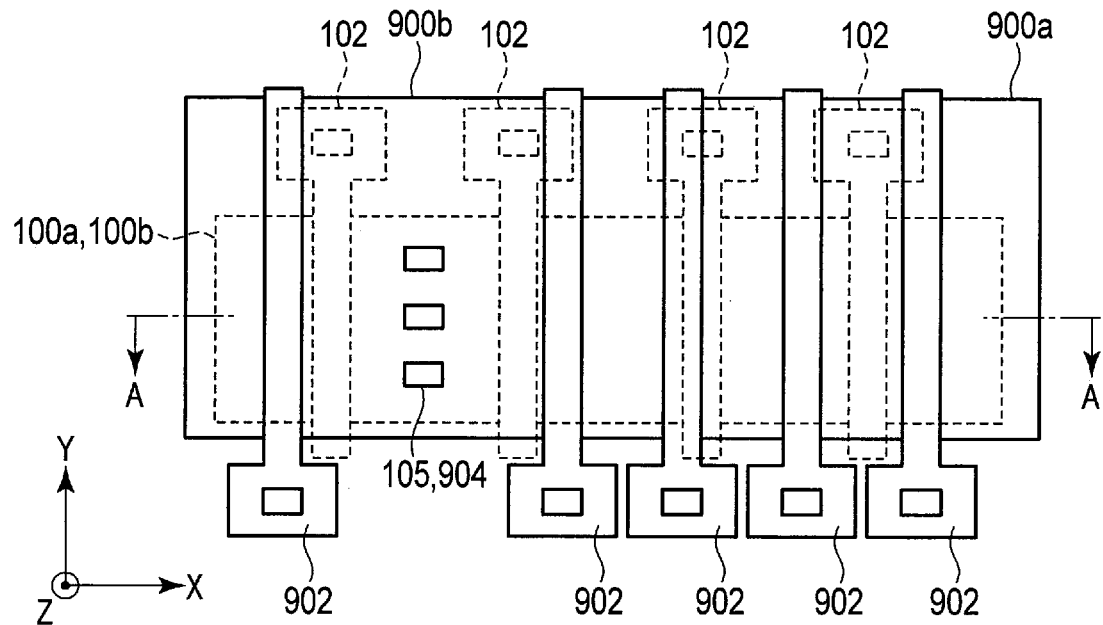
FIG. 23A is a top view of a semiconductor device according to another modification.
Figure 23B:
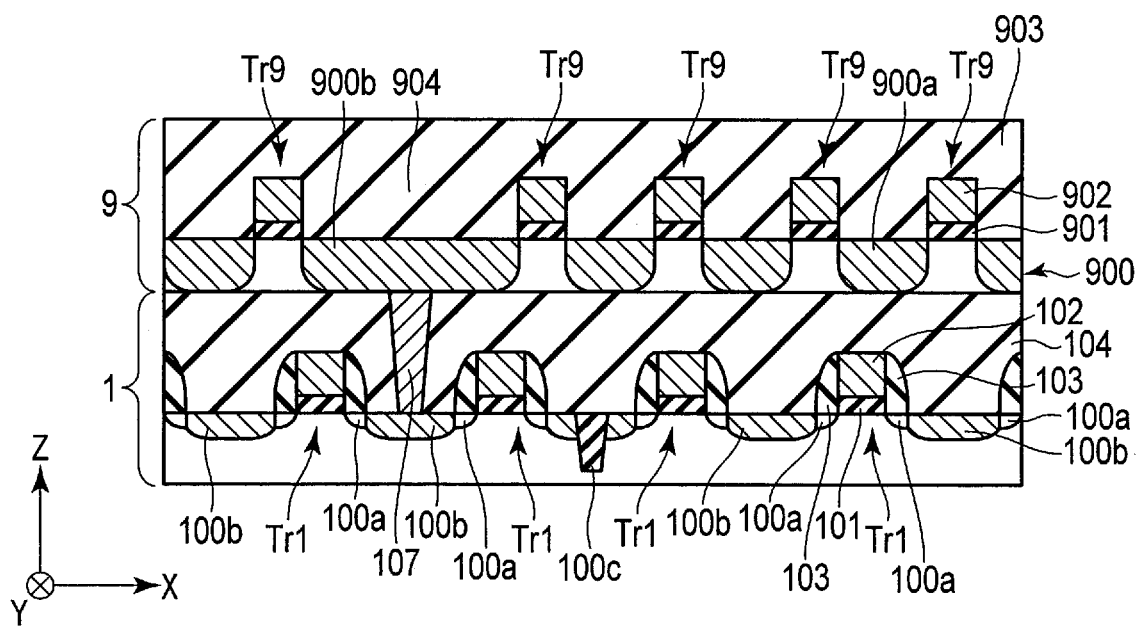
FIG. 23B is a cross-sectional view of the semiconductor device according to the another modification.

Additionally, in the above-described embodiments, the first transistor formation region 1 and second transistor formation region 2 are connected by the contact plug 105 and contact plug 204 using TV (Through Via) technology. In addition, the configuration is illustrated in which, in the second transistor formation region 2, the source/drain region is formed in the opening in which the contact plug 204 is formed. However, the embodiments are not limited to this configuration. For example, as illustrated in FIG. 23A and FIG. 23B, the first transistor formation region 1 may be electrically connected to a ninth transistor formation region 9 via a contact plug 107. In this case, in the ninth transistor formation region 9, source/drain regions 900$a$ and 900$b$ are made into semiconductor-metal compounds in a manner to extend from the top surface to back surface of a semiconductor substrate 900. In addition, the contact plug 107 is formed on the source/drain region 100$b$ of the first transistor formation region 1, and comes in direct contact with the source/drain region 900$b$. Thereby, the first transistor formation region 1 and ninth transistor formation region 9 can be electrically connected without forming a contact hole in the semiconductor substrate 900. As described above, according to the structure illustrated in FIG. 23A and FIG. 23B, since there is no need to form a contact hole in the semiconductor substrate 900, the number of semiconductor fabrication steps can be reduced. The structure illustrated in FIG. 23A and FIG. 23B can be variously combined with the above-described embodiments.

Additionally, in the above-described embodiments, the materials and fabrication methods of the transistors Tr2, various wiring lines, insulation films, etc. are variously changeable, unless anneal at temperatures exceeding 500° C. is performed after the source/drain region 100*b* of the first transistor formation region is formed.

Additionally, in the above-described first embodiment, second embodiment, etc., nickel is used as a silicide material. Alternatively, cobalt (Co), etc. may be used.

Although the embodiments of the present invention have been described above, the invention is not limited to the above embodiments, and various modifications may be made without departing from the spirit of the invention. Further, the embodiments include various inventions at various stages, and various inventions may be derived by properly combining structural elements disclosed in the embodiments. For example, even if some structural elements are omitted from the structural elements disclosed in the embodiments, structures from which these structural elements are omitted may be derived as inventions if predetermined advantageous effects can be achieved.

What is claimed is:

1. A manufacturing method of a semiconductor device, comprising:
    a step of forming gate structures of a plurality of first transistors on a first semiconductor layer;
    a step of forming a plurality of first diffusion regions in the first semiconductor layer, where the gate structures of the first transistors are not formed;
    a step of forming an interlayer insulation film covering the first semiconductor layer and the plurality of first transistors;
    a step of forming a first conductor in the interlayer insulation film, the first conductor being electrically connected to the first diffusion region;
    a step of forming a second semiconductor layer on the interlayer insulation film and on the first conductor;
    a step of forming a region, which becomes an active region, in the second semiconductor layer, and forming a through-hole, which penetrates the second semiconductor layer, on the first conductor;
    a step of forming gate structures of a plurality of second transistors on the second semiconductor layer;
    a step of forming a metallic film on the second semiconductor layer at a place where the gate structures of the second transistors are not formed, and on an inner wall of the through-hole;
    a step of forming a plurality of second diffusion regions in the second semiconductor layer, where the gate structures of the second transistors are not formed, and forming a third diffusion region on the inner wall of the through-hole penetrating the second semiconductor layer by reacting the metallic film with the second semiconductor layer; and
    a step of forming a second conductor which is formed in the through-hole and is electrically connected to the first conductor and the third diffusion region.

2. The manufacturing method of a semiconductor device of claim 1, wherein the step of forming the metal compound film is carried out by anneal at temperatures of less than 500° C.

3. The manufacturing method of a semiconductor device of claim 1, wherein the second semiconductor layer is silicon (Si), polysilicon (poly-Si), amorphous silicon (a-Si), germanium (Ge), polygermanium (poly-Ge), amorphous germanium (a-Ge), germanium tin (GeSn), polygermanium tin (poly-GeSn), amorphous germanium tin (a-GeSn), or a compound thereof.

4. The manufacturing method of a semiconductor device of claim 1, wherein the second semiconductor layer is gallium arsenic (GaAs), indium gallium arsenic (InGaAs), indium arsenic (InAs), indium phosphorus (InP), indium antimony (InSb), indium gallium phosphorus (InGaP), gallium antimony (GaSb), gallium phosphorus (GaP), or a compound thereof.

5. The manufacturing method of a semiconductor device of claim 1, wherein the step of forming the second diffusion region and the third diffusion region includes:
    a step of removing oxygen in the second semiconductor layer, where the second transistor is not formed, and in the through-hole.

6. The manufacturing method of a semiconductor device of claim 1, wherein the second semiconductor layer is an oxide semiconductor of zinc oxide (ZnO) or indium gallium zinc oxide (InGaZnO).

7. The manufacturing method of a semiconductor device of claim 1, wherein the metallic film formed on a upper surface and a side surface of the second semiconductor layer reacts with the second semiconductor layer.

* * * * *